(12) United States Patent (10) Patent No.: US 9,041,429 B2
Clark (45) Date of Patent: May 26, 2015

(54) SEQUENTIAL STATE ELEMENTS FOR TRIPLE-MODE REDUNDANT STATE MACHINES, RELATED METHODS, AND SYSTEMS

(71) Applicant: Lawrence T. Clark, Phoenix, AZ (US)

(72) Inventor: Lawrence T. Clark, Phoenix, AZ (US)

(73) Assignee: Arizona Board of Regents, a body corporate of the State of Arizona, acting for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/062,127

(22) Filed: Oct. 24, 2013

(65) Prior Publication Data

US 2014/0049286 A1 Feb. 20, 2014

Related U.S. Application Data

(63) Continuation-in-part of application No. 13/487,859, filed on Jun. 4, 2012, now Pat. No. 8,791,718.

(60) Provisional application No. 61/717,713, filed on Oct. 24, 2012, provisional application No. 61/492,451, filed on Jun. 2, 2011.

(51) Int. Cl.
  *H03K 19/003* (2006.01)
  *G06F 17/50* (2006.01)
  *H03K 19/0185* (2006.01)

(52) U.S. Cl.
  CPC ...... *H03K 19/0033* (2013.01); *H03K 19/00315* (2013.01); *G06F 17/5045* (2013.01); *H03K 19/018521* (2013.01)

(58) Field of Classification Search
  None
  See application file for complete search history.

(56) References Cited

U.S. PATENT DOCUMENTS

| 4,621,201 | A | * | 11/1986 | Amdahl et al. ............. 326/11 |
| 5,883,814 | A | | 3/1999 | Luk et al. |
| 6,104,211 | A | | 8/2000 | Alfke |
| 6,127,864 | A | | 10/2000 | Mavis et al. |
| 6,526,559 | B2 | | 2/2003 | Schiefele et al. |

(Continued)

OTHER PUBLICATIONS

Anelli, G. et al., "Radiation Tolerant VLSI Circuits in Standard Deep Submicron CMOS Technologies for the LHC Experiments: Practical Design Aspects," IEEE Transactions on Nuclear Science, vol. 46, Issue 6, pp. 1690-1696, (1999).

(Continued)

*Primary Examiner* — Jason M Crawford
*Assistant Examiner* — Nelson Correa
(74) *Attorney, Agent, or Firm* — Withrow & Terranova, P.L.L.C.

(57) ABSTRACT

The disclosure relates generally to sequential state elements (SSEs), triple-mode redundant state machines (TMRSMs), and methods and systems for testing triple-mode redundant pipeline stages (TMRPSs) within the TMRSMs using triple-mode redundant SSEs (TMRSSEs). The SSEs, TMRSMs, TMRPSs, and TMRSSEs may be formed as integrated circuits on a semiconductor substrate. Of particular focus in this disclosure are SSEs used to sample and hold bit states. Embodiments of the SSEs have a self-correcting mechanism to protect against radiation-induced soft errors. The SSE may be provided in a pipeline circuit of a TMRSM to receive and store a bit state of a bit signal generated by combinational circuits within the pipeline circuit. More specifically, the SSEs may be provided in a TMRSSE configured to perform self-correction. Also disclosed are methods for using the TMRSSE to test redundant pipeline stages of the TMRSM.

32 Claims, 20 Drawing Sheets

(56) References Cited

U.S. PATENT DOCUMENTS

| | | | |
|---|---|---|---|
| 6,646,464 | B2 | 11/2003 | Maruyama |
| 6,898,770 | B2 | 5/2005 | Boluki et al. |
| 7,138,442 | B2 | 11/2006 | Smith et al. |
| 7,212,448 | B1 * | 5/2007 | Trimberger .............. 365/189.02 |
| 7,310,759 | B1 * | 12/2007 | Carmichael et al. .......... 714/725 |
| 7,404,161 | B2 | 7/2008 | Dutt et al. |
| 7,649,216 | B1 | 1/2010 | Clark et al. |
| 7,719,304 | B1 * | 5/2010 | Clark et al. ...................... 326/14 |
| 7,859,292 | B1 * | 12/2010 | Shuler, Jr. ........................ 326/11 |
| 7,904,772 | B2 | 3/2011 | Nicolaidis |
| 7,920,410 | B1 | 4/2011 | Lee et al. |
| 8,015,533 | B1 | 9/2011 | Burstein et al. |
| 8,122,317 | B1 | 2/2012 | Clark et al. |
| 8,161,367 | B2 | 4/2012 | Chandra |
| 8,397,130 | B2 | 3/2013 | Clark et al. |
| 8,397,133 | B2 | 3/2013 | Clark et al. |
| 8,489,919 | B2 | 7/2013 | Clark et al. |
| 8,493,120 | B2 | 7/2013 | Choudhury et al. |
| 8,495,548 | B2 | 7/2013 | Agarwal et al. |
| 8,729,923 | B2 * | 5/2014 | Ramachandra ................. 326/11 |
| 8,791,718 | B2 * | 7/2014 | Clark et al. ...................... 326/46 |
| 8,863,064 | B1 | 10/2014 | Tien et al. |
| 2006/0220700 | A1 | 10/2006 | Hoover et al. |
| 2009/0184733 | A1 | 7/2009 | Lilja |
| 2009/0204933 | A1 * | 8/2009 | Rezgui ............................ 716/10 |
| 2012/0180005 | A1 | 7/2012 | Lilja |
| 2012/0306535 | A1 | 12/2012 | Clark et al. |
| 2014/0049286 | A1 * | 2/2014 | Clark .............................. 326/16 |

OTHER PUBLICATIONS

Benedetto, J. M. et al., "Digital Single Event Transient Trends with Technology Node Scaling," IEEE Transactions on Nuclear Science, vol. 53, Issue 6, pp. 3462-3465 (2006).

Benedetto, J. et al., "Heavy Ion-Induced Digital Single-Event Transients in Deep Submicron Processes," IEEE Transactions on Nuclear Science, vol. 51, Issue 6, pp. 3480-3485 (2004).

Benini, L. et al., "A Survey of Design Techniques for System-Level Dynamic Power Management," IEEE Transactions on Very Large Scale Integration (VLSI) Systems, vol. 8, Issue 3, pp. 299-316 (2000).

Diehl, S.E. et al., "Considerations for Single Event Immune VLSI Logic," IEEE Transactions on Nuclear Science, vol. 30, Issue 6, pp. 4501-4507 (1983).

Dodd, P. et al., "Production and Propagation of Single-Event Transients in High-Speed Digital Logic ICs," IEEE Transactions on Nuclear Science, vol. 51, Issue. 6, pp. 3278-3284 (2004).

Gadlage, M. et al., "Single Event Transient Pulsewidths in Digital Microcircuits," IEEE Transactions on Nuclear Science, vol. 51, Issue. 6, pp. 3285-3290 (2004).

Hansen, D. et al., "Clock, Flip-Flop, and Combinatorial Logic Contributions to the SEU Cross Section in 90 nm ASIC Technology," IEEE Transactions on Nuclear Science, vol. 56, Issue 6, pp. 3542-3550 (2009).

Hindman, N. D. et al., "Fully Automated, Testable Design of Fine-Grained Triple Mode Redundant Logic," IEEE Transactions on Nuclear Science, vol. 58, Issue 6, pp. 3046-3052 (2011).

Hoang, T. et al., "A Radiation Hardened 16-Mb SRAM for Space Applications," IEEE Aerospace Conference, Mar. 3-10, 2007, pp. 1-6.

Kobayashi, D. et al., "Analytical Expression for Temporal Width Characterization of Radiation-Induced Pulse Noises in SOI CMOS Logic Gates," IEEE IRPS, pp. 165-169 (2009).

Ricci, F. et al., "A 1.5 GHz 90 nm Embedded Microprocessor Core," 2005 Symposium on VLSI Circuits Digest of Technical Papers, pp. 12-15 (2005).

Sexton, F.W. et al., "SEU Simulation and Testing of Resistor-Hardened D-latches in the SA3300 Microprocessor," IEEE Transactions on Nuclear Science, vol. 38, Issue 6, pp. 1521-1528, (1991).

Shambhulingaiah, S. et al., "Temporal Sequential Logic Hardening by Design with a Low Power Delay Element," RADECS 2011 Proceedings, pp. 144-149, (2011).

Shuler, R. et al., "Comparison of Dual-Rail and TMR Logic Cost Effectiveness and Suitability for FPGAs with Reconfigurable SEU Tolerance," IEEE Transactions on Nuclear Science, vol. 56, Issue 1, pp. 214-219 (2009).

Tipton, A. D. et al., "Device-Orientation Effects on Multiple-Bit Upset in 65 nm SRAMs," IEEE Transactions on Nuclear Science, vol. 55, Issue 6, pp. 2880-2885 (2008).

Turowski, M. et al., "Mixed-Mode Simulation and Analysis of Digital Single Event Transients in Fast CMOS ICs," 14th International Conference of Mixed Design, Jun. 21-23, 2007, pp. 433-438.

Warren, K. et al., "Heavy Ion Testing and Single Event Upset Rate Prediction Considerations for a DICE Flip-Flop," IEEE Transactions on Nuclear Science, vol. 56, Issue 6, pp. 3130-3137 (2009).

Author Unknown, "RTAX-S/SL and RTAX-DSP Radiation-Tolerant FPGAs," Microsemi Corporation, Revision 15, May 2012, 278 pages, www.actel.com/documents/RTAXS_DS.pdf.

Calin, T., et al., "Upset Hardened Memory Design for Submicron CMOS Technology," IEEE Transactions on Nuclear Science, vol. 43, No. 6, Dec. 1996, pp. 2874-2878.

Drake, Alan J., et al., "A Self-Correcting Soft Error Tolerant Flop-Flop," 12th NASA Symposium on VLSI Design, Oct. 4-5, 2005, 5 pages.

Knudsen, Jonathan E., et al., "An Area and Power Efficient Radiation Hardened by Design Flip-Flop," IEEE Transactions on Nuclear Science, vol. 53, No. 6, Dec. 2006, pp. 3392-3399.

Lacoe, Ronald C., et al., "Application of Hardness-By-Design Methodology to Radiation-Tolerant ASIC Technologies," IEEE Transactions on Nuclear Science, vol. 47, No. 6, Dec. 2000, pp. 2334-2341.

Matush, Bradley I., et al., "Area-Efficient Temporally Hardened by Design Flip-Flop Circuits," IEEE Transactions on Nuclear Science, vol. 57, No. 6, Dec. 2010, pp. 3588-3595.

Mavis, David G., et al., "Soft Error Rate Mitigation Techniques for Modern Microcircuits," 40th Annual International Reliability Physics Symposium, Copyright: 2002, pp. 216-225.

Morgan, Keith S., et al., "A Comparison of TMR with Alternative Fault-Tolerant Design Techniques for FPGAs," IEEE Transactions on Nuclear Science, vol. 54, No. 6, Dec. 2007, pp. 2065-2072.

Quinn, Heather, et al., "A Review of Xilinx FPGA Architectural Reliability Concerns from Virtex to Virtex-5," Radiation and Its Effects on Components and Systems (RADECS), Sep. 2007, 8 pages.

Non-Final Office Action for U.S. Appl. No. 13/487,859, mailed Sep. 6, 2013, 17 pages.

Notice of Allowance for U.S. Appl. No. 13/487,859, mailed Mar. 20, 2014, 13 pages.

Quayle Action for U.S. Appl. No. 14/304,155, mailed Nov. 28, 2014, 7 pages.

Non-Final Office Action for U.S. Appl. No. 14/031,585, mailed Nov. 28, 2014, 8 pages.

* cited by examiner

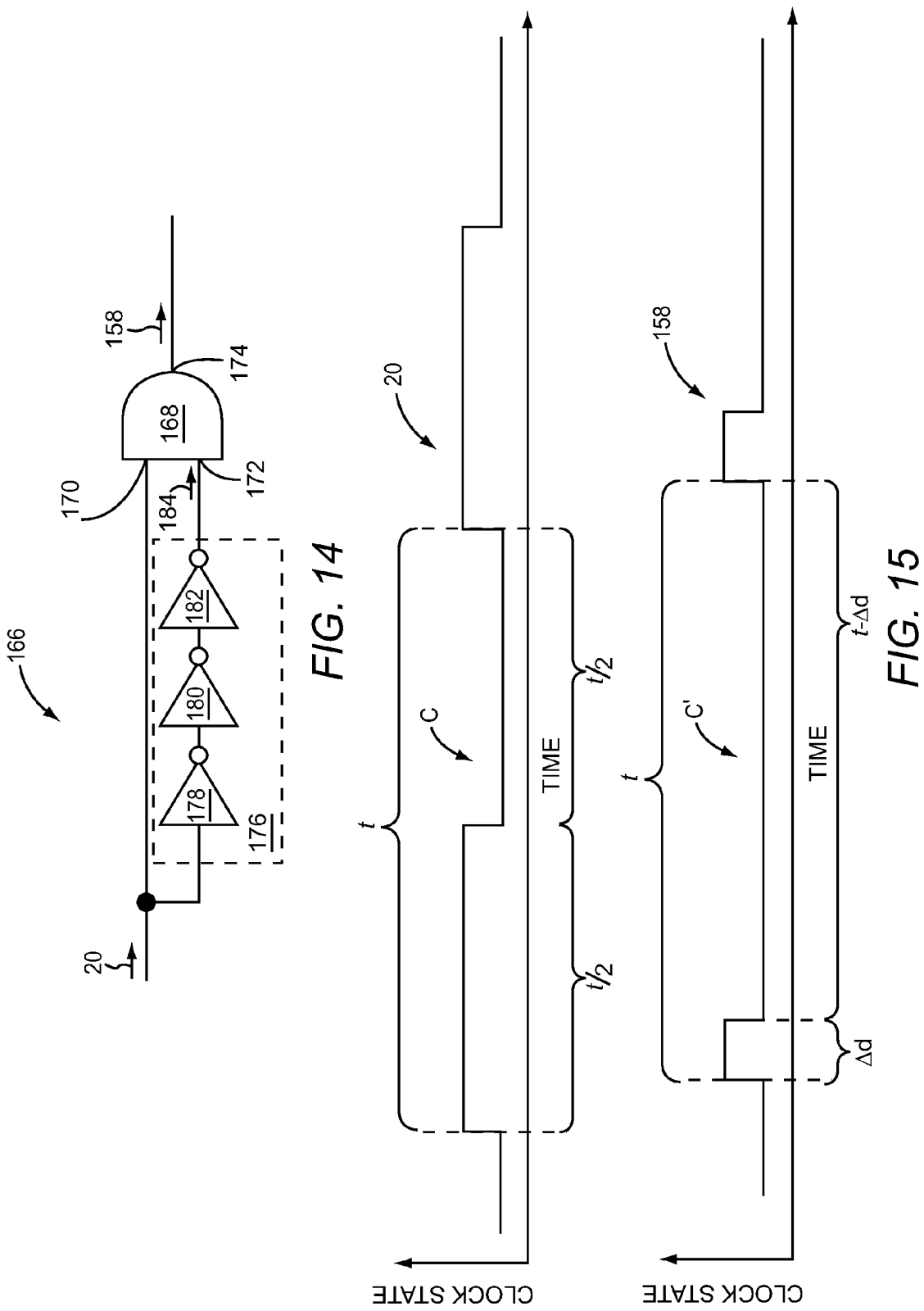

SEQUENTIAL STATE ELEMENTS FOR TRIPLE-MODE REDUNDANT STATE MACHINES, RELATED METHODS, AND SYSTEMS

RELATED APPLICATIONS

This application claims the benefit of Provisional Patent Application Ser. No. 61/717,713, filed on Oct. 24, 2012 and entitled "TRIPLE REDUNDANT SELF-CORRECTING FLIP-FLOPS FOR RADIATION HARDENED INTEGRATED CIRCUITS," the disclosure of which is hereby incorporated herein by reference in its entirety.

This application is a continuation-in-part of U.S. patent application Ser. No. 13/487,859, filed on Jun. 4, 2012 and entitled "STRUCTURES AND METHODS FOR DESIGN AUTOMATION OF RADIATION HARDENED TRIPLE MODE REDUNDANT DIGITAL CIRCUITS," which claims the benefit of and priority to U.S. Provisional Patent Application Ser. No. 61/492,451, filed on Jun. 2, 2011 and entitled "STRUCTURES AND METHODS FOR DESIGN AUTOMATION OF RADIATION HARDENED TRIPLE MODE REDUNDANT DIGITAL CIRCUITS," the disclosures of which are hereby incorporated herein by reference in their entireties.

FIELD OF THE DISCLOSURE

The disclosure relates generally to triple-mode redundant (TMR) state machines and method and systems for designing TMR state machines.

BACKGROUND

State machines built from integrated circuits need to be radiation hardened to prevent soft errors that occur when a high energy particle travels through the integrated circuit's semiconductor substrate. This is particularly important when the state machine operates in high radiation environments such as outer space. An ionizing particle traveling through the semiconductor substrate may cause a transient voltage glitch, i.e., a single event transient (SET), or may cause a sequential state element to store the wrong state, i.e., a single event upset (SEU).

One technique for mitigating such effects of high energy radiation is to provide a self-correcting triple-mode redundant (TMR) circuit. In this manner, if a radiation strike results in a soft error in one copy of the circuit, the other two copies of the circuit can correct the soft error in the affected copy of the circuit through self-correction techniques. However, charge collection can affect multiple circuit nodes, requiring the critical nodes of redundant circuits to be spatially separated so that one ionizing track does not affect multiple circuit nodes, thereby defeating the self-correcting mechanism of the redundancy.

TMR has been used extensively in many state machines, such as Field Programmable Gate Arrays (FPGAs). Unfortunately, the arrangement and functionality of these circuits has proven inadequate in high radiation environments. In particular, these FPGAs suffer from "domain crossing" errors where charge collection can affect multiple circuit copies, thwarting TMR correction. It is thus essential that a logic design methodology aimed at application specific integrated circuits (ASICs) guarantee an adequate minimum spatial separation of critical nodes, which is difficult since standard CAD software, whether aimed at FPGAs or ASICs, attempts to minimize delay and power by placing logic nodes as close to each other as possible.

Accordingly, what is needed are more robust radiation hardened integrated circuit configurations and techniques to design radiation hardened integrated circuits.

SUMMARY

The disclosure relates generally to sequential state elements (SSEs), triple-mode redundant state machines (TMRSMs), and methods and systems for testing triple-mode redundant pipeline stages (TMRPSs) within the TMRSMs using triple-mode redundant SSEs (TMRSSEs). The SSEs, TMRSMs, TMRPSs, and TMRSSEs may be formed as integrated circuits on a semiconductor substrate. Of particular focus in this disclosure are SSEs used to sample and hold bit states. Embodiments of the SSEs have a self-correcting mechanism to protect against radiation-induced soft errors. The SSE may be provided in a pipeline circuit of a TMRSM to receive and store a bit state of a bit signal generated by combinational circuits within the pipeline circuit. More specifically, the SSEs may be provided in a TMRSSE configured to perform self-correction. Also disclosed are methods for using the TMRSSE to test redundant pipeline stages of the TMRSM.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 14 illustrates one embodiment of a clock generation circuit, which may be utilized to generate an asymmetric clock signal from a clock signal.

FIG. 15 illustrates one embodiment of the asymmetric clock signal and the clock signal used to generate the asymmetric clock signal.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to systems, devices, and methods related to state machines and sequential state elements (SSEs) for the state machines. State machines are generally formed as integrated circuits (ICs) within a semiconductor substrate. The state machines are synchronized by one or more clock signals to pass and receive binary bit states. In its simplest form, a state machine may include a single combinational logic element and a single SSE coupled to the combinational logic element. The SSE receives an input bit signal and generates an output bit signal. An output bit state of the output bit signal is based on an input bit state of the input bit signal and the bit states are passed by the SSE in accordance with the clock signal(s). The combinational logic element either receives the output bit signal from the SSE or provides an input bit signal to the SSE. In either case, the passing of bit states to or from the combinational logic element is synchronized by the clock signal(s).

The state machine may be more complex and may be configured as a pipeline circuit having multiple pipeline stages. Each pipeline stage includes a combinational logic circuit and a sequential state circuit and the pipeline stages are coupled sequentially. Thus, the state machine may be any type of pipelined digital circuit or a portion thereof. For example, the state machine may be a microprocessor, or any portion of a microprocessor such as an arithmetic logic unit (ALU), a register file, instruction memory, data memory, and/or the like.

Figure 1:
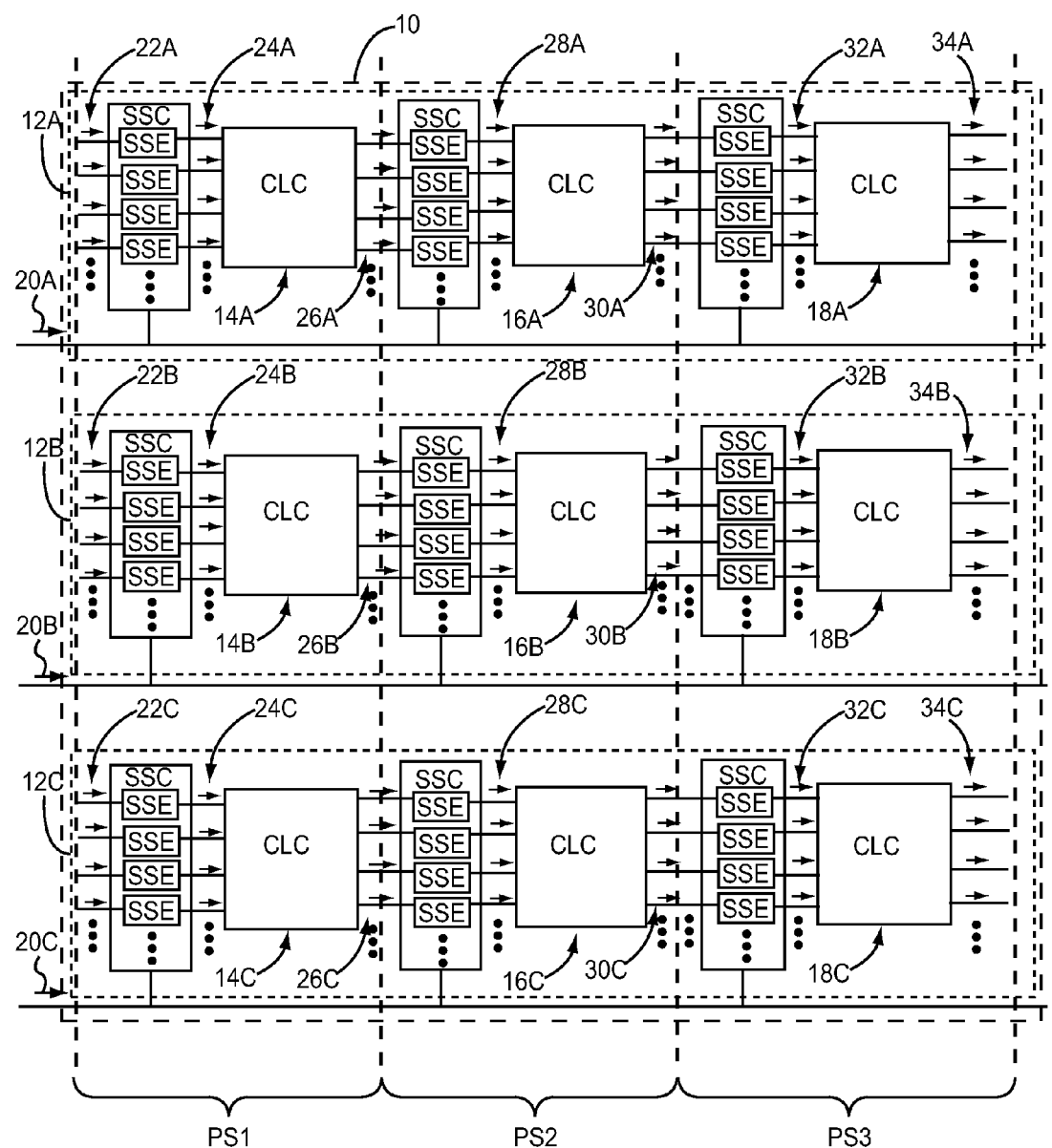
FIG. 1 illustrates a block diagram of one embodiment of a triple-mode redundant state machine (TMRSM) that includes three pipeline circuits with pipeline stages that each include combinational logic circuits (CLCs) and sequential state circuits (SSCs).

FIG. 1 illustrates a block diagram of one embodiment of a triple-mode redundant state machine (TMRSM) 10. In the TMRSM 10, there are three redundant pipeline circuits (referred to generically with reference numeral 12 and individually as elements 12A-12C). Thus, the pipeline circuit 12A, the pipeline circuit 12B, and the pipeline circuit 12C are redundant versions of the same pipeline circuit. In the TMRSM 10, there are three redundant state machines where a first redundant state machine is provided by the pipeline circuit 12A, a second redundant state machine is provided by the pipeline circuit 12B, and a third redundant state machine is provided by the pipeline circuit 12C. Note, however, that although each of the pipeline circuits 12 is redundant, the pipeline circuit 12A, the pipeline circuit 12B, and the pipeline circuit 12C may not be exact replicas of one another. For example, one or more of the pipeline circuits 12 may be logically inverted with respect to the other pipeline circuits 12.

Each of the pipeline circuits 12 is a finite state machine. The operation of the pipeline circuits 12 may be loosely analogized to an assembly line. More specifically, each of the pipeline circuits 12 has pipeline stages (referred to generically for each of the pipeline circuits 12 as elements 14, 16, 18, and specifically for the individual pipeline circuits 12 as elements 14A-14C, 16A-16C, and 18A-18C). In each of the pipeline circuits 12, the different pipeline stages 14, 16, 18 handle a different operation of the finite state machine so that the various operations of the particular finite state machine are handled essentially in a series fashion. Examples of operations that may be provided by the different pipeline stages 14, 16, 18 for the particular finite state machines include instruction fetch operations, instruction decode operations, encode operations, register file operand fetch operations, instruction execution operations, data memory access operations, register file write back operations, and/or the like. Since the TMRSM 10 shown in FIG. 1 has three redundant finite state machines, the pipeline stage 14A in the pipeline circuit 12A, the pipeline stage 14B in the pipeline circuit 12B, and the pipeline stage 14C in the pipeline circuit 12C are configured to provide the same operation. The pipeline stage 16A in the pipeline circuit 12A, the pipeline stage 16B in the pipeline circuit 12B, and the pipeline stage 16C in the pipeline circuit 12C are configured to provide the same operation. The pipeline stage 18A in the pipeline circuit 12A, the pipeline stage 18B in the pipeline circuit 12B, and the pipeline stage 18C in the pipeline circuit 12C are configured to provide the same operation.

As shown in FIG. 1, the different pipeline stages 14, 16, 18 of each of the pipeline circuits 12 include combinational logic circuits (CLCs) and sequential state circuits (SSCs). In each of the pipeline circuits 12, the CLC of the different pipeline stages 14, 16, 18 is specialized to handle the particular operation of the particular pipeline stage 14, 16, 18. Accordingly, for each of the pipeline stages 14, 16, 18 in the pipeline circuits 12, the CLCs include an arrangement of combinational logic elements (i.e., logic gates) configured to provide logic that implements the operation of the pipeline stage 14, 16, 18. Static combinational logic elements and/or dynamic combinational logic elements may be utilized. While each of the pipeline circuits 12 shown in FIG. 1 has three pipeline stages 14, 16, 18, it should be noted that alternative embodiments of the TMRSM 10 may include any number of pipeline stages. This may depend on the particular finite state machine to be provided by each of the pipeline circuits 12 for a particular application.

To synchronize the pipeline stages 14, 16, 18 of each of the pipeline circuits 12, the SSCs coordinate transfer of valid states between the different pipeline stages 14, 16, 18 in accordance with a clock signal (referred to generically with reference numeral 20, and individually as elements 20A-20C). The clock signal 20A received by the pipeline circuit 12A, the clock signal 20B received by the pipeline circuit 12B, and the clock signal 20C received by the pipeline circuit 12C may be the same clock signal 20 or a different clock signal 20. This may depend, for example, on the particular clock distribution technique used for the TMRSM 10. It should be noted that in this particular embodiment, each of the pipeline circuits 12 is assumed to be arranged in a single-phase clock style so that each of the SSCs in the different pipeline stages 14, 16, 18 receives a copy of the clock signal 20 with the same timing. Alternatively, multiple-phase clock styles may be used. When multiple-phase clock styles are implemented, one or more of the SSCs in the different pipeline stages 14, 16, 18 may receive a different clock signal, like the clock signal 20, within each of the pipeline circuits 12. Additionally, when the CLCs are implemented using dynamic combinational logic elements, coordination of pre-charging may be coordinated by different clock signals, like the clock signal 20, if desired.

For each of the pipeline circuits 12, the SSC in the pipeline stage 14 receives a data input (referred to generically with reference numeral 22 and specifically with reference numerals 22A-22C). Based on the data input 22 and in accordance with the clock signal 20, the SSC in the pipeline stage 14 of each of the pipeline circuits 12 generates a data output (referred to generically with reference numeral 24 and specifically with reference numerals 24A-24C). In this embodiment, the data input 22 for each the pipeline stages 14 includes a plurality of input bit signals that provide the various bits of the data input 22. Accordingly, the data output 24 from the SSC of each of the pipeline stages 14 includes a plurality of output bit signals that provide the various bits of the data output 24. Multiple SSEs are thus included in the SSC of each of the pipeline stages 14, 16, 18.

More specifically, the SSC in the pipeline stage 14A provides an SSE to receive each input bit signal in the data input 22A and to generate each output bit signal in the data output 24A. The SSC in the pipeline stage 14B has an SSE to receive each input bit signal in the data input 22B and generate each output bit signal in the data output 24B. The SSC in the pipeline stage 14C has an SSE to receive each input bit signal in the data input 22C and generate each output bit signal in the data output 24C. The CLCs of each of the pipeline stages 14 perform the designated pipeline operation in accordance with their logical arrangement to generate a data input (referred to generically with reference numeral 26 and specifically with reference numerals 26A-26C) for each of the next pipeline stages 16. The pipeline stage 14A in the pipeline circuit 12A, the pipeline stage 14B in the pipeline circuit 12B, and the pipeline stage 14C in the pipeline circuit 12C form a triple-mode redundant pipeline stage (TMRPS) PS1.

It should be noted that the data inputs 22 may have any number of input bit signals depending on a data type. The data inputs 26 may also have any number of input bit signals according to a data type. However, the data inputs 22 and the data inputs 26 may have different numbers of input bit signals since the data types of the data inputs 22 and the data inputs 26 may be different. To illustrate one non-limiting example, if the pipeline stages 14 each provide a decoding operation, the number of input bit signals in the data inputs 22 would be greater than the number of input bit signals in the data inputs 26. In another non-limiting example, if the pipeline stages 14 each provide an encoding operation, the number of input bit signals in the data inputs 22 would be less than the number of input bit signals in the data inputs 26.

For each of the pipeline circuits 12, the SSC in the pipeline stage 16 receives the data input 26 from the previous pipeline stage 14. Based on the data input 26 and in accordance with the clock signal 20, the SSC in the pipeline stage 16 of each of the pipeline circuits 12 generates a data output (referred to generically with reference numeral 28 and specifically with reference numerals 28A-28C). As mentioned above, the data input 26 for each the pipeline stages 16 includes a plurality of input bit signals that provide the various bits of the data input 26. Accordingly, the data output 28 from the SSC of each of the pipeline stages 16 includes a plurality of output bit signals that provide the various bits of the data output 28. Multiple SSEs are thus included in the SSC of each of the pipeline stages 16.

More specifically, the SSC in the pipeline stage 16A provides an SSE to receive each input bit signal in the data input 26A and to generate each output bit signal in the data output 28A. The SSC in the pipeline stage 16B has an SSE to receive each input bit signal in the data input 26B and generate each output bit signal in the data output 28B. The SSC in the pipeline stage 16C has an SSE to receive each input bit signal in the data input 26C and generate each output bit signal in the data output 28C. The CLCs of each of the pipeline stages 16 perform the designated pipeline operation in accordance with their logical arrangement to generate a data input (referred to generically with reference numeral 30 and specifically with reference numerals 30A-30C) for each of the next pipeline stages 18. The data inputs 26 and the data inputs 30 may or may not have different numbers of input bit signals depending on their data types. The pipeline stage 16A in the pipeline circuit 12A, the pipeline stage 16B in the pipeline circuit 12B, and the pipeline stage 16C in the pipeline circuit 12C form a TMRPS PS2.

For each of the pipeline circuits 12, the SSC in the pipeline stage 18 receives the data input 30 from the previous pipeline stage 16. Based on the data input 30 and in accordance with the clock signal 20, the SSC in the pipeline stage 18 of each of the pipeline circuits 12 generates a data output (referred to generically with reference numeral 32 and specifically with reference numerals 32A-32C). In FIG. 1, the data input 30 for each the pipeline stages 18 includes a plurality of input bit signals that provide the various bits of the data input 30. Accordingly, the data output 32 from the SSC of each of the pipeline stages 16 includes a plurality of output bit signals that provide the various bits of the data output 32. Multiple SSEs are thus included in the SSC of each of the pipeline stages 18.

More specifically, the SSC in the pipeline stage 18A provides an SSE to receive each input bit signal in the data input 30A and to generate each output bit signal in the data output 32A. The SSC in the pipeline stage 18B has an SSE to receive each input bit signal in the data input 30B and generate each output bit signal in the data output 32B. The SSC in the pipeline stage 18C has an SSE to receive each input bit signal in the data input 30C and generate each output bit signal in the data output 32C. The CLCs of each of the pipeline stages 18 perform the designated pipeline operation in accordance with their logical arrangement to generate a data input (referred to generically with reference numeral 34 and specifically with reference numerals 34A-34C). The data inputs 30 and the data inputs 34 may or may not have different numbers of input bit signal depending on their data types. The pipeline stage 18A in the pipeline circuit 12A, the pipeline stage 18B in the pipeline circuit 12B, and the pipeline stage 18C in the pipeline circuit 12C form a TMRPS PS3.

As mentioned above, different embodiments of the TMRSM 10 may have any number of pipeline stages. For instance, the data inputs 34 may be transmitted externally to one or more external devices or may be provided to pipeline stages downstream from the pipeline stages 18. Similarly, the data inputs 22 for the pipeline stages 14 may be received from external devices or may be received from upstream pipeline stages. In fact, as explained below, any design for a finite state machine may be triplicated to provide a design for an embodiment of the TMRSM 10.

Figure 2:
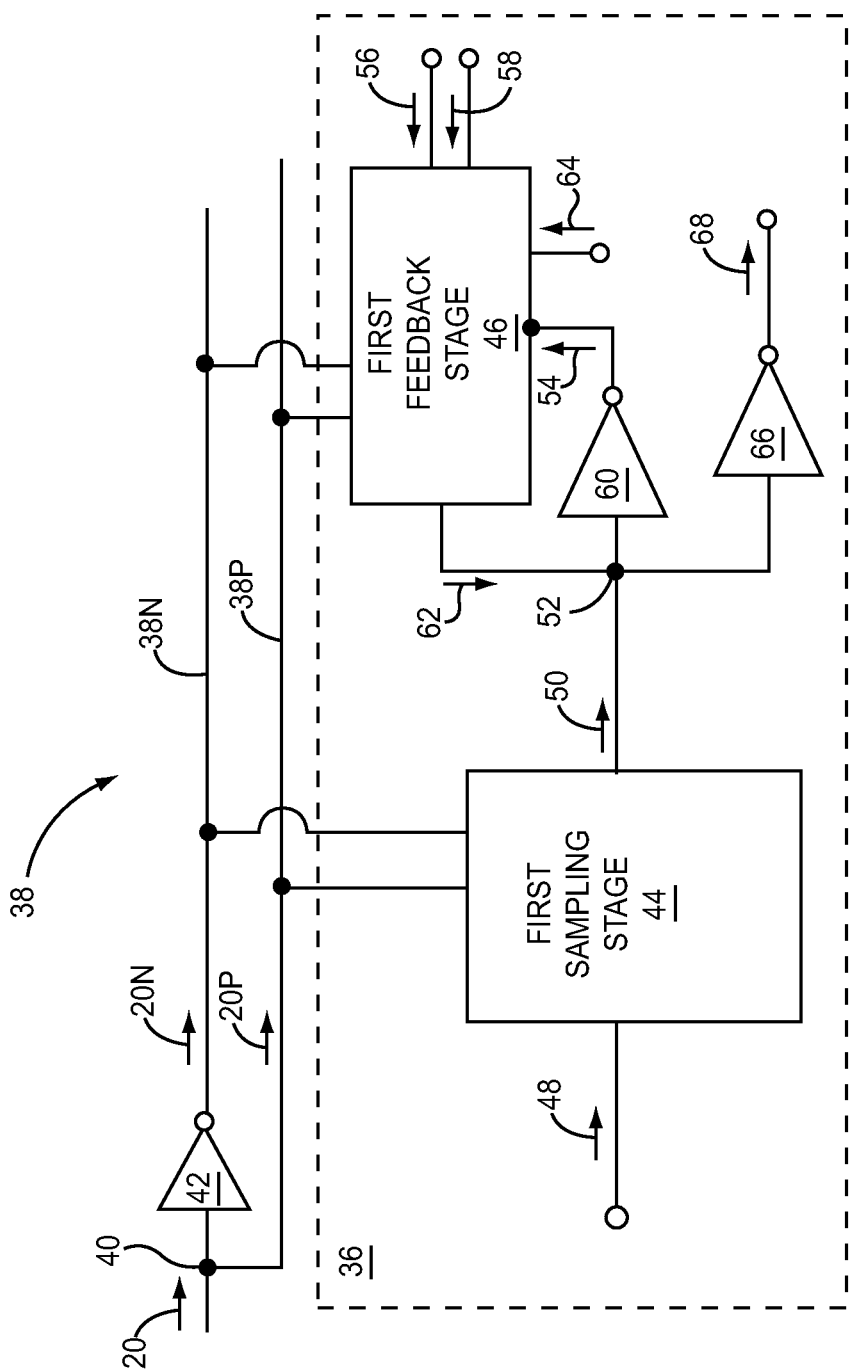
FIG. 2 illustrates a block diagram of an exemplary latch, which is an exemplary sequential state element (SSE) that may be utilized within the SSCs shown in FIG. 1.

Referring now to FIG. 2, FIG. 2 illustrates a block diagram of an exemplary SSE. The general purpose of SSEs is to hold bit states for processing by the CLCs while preventing subsequent bit states from entering the CLCs too soon. In FIG. 2, the SSE illustrates one embodiment of a latch 36. Embodiments of the latch 36 may be provided as one or more of the SSEs within the SSCs shown in FIG. 1. Other types of SSEs that may be provided within the SSCs include flip-flops and bistables.

The latch 36 shown in FIG. 2 is synchronizable in accordance with the clock signal 20, which oscillates between a first clock state and a second clock state. The amount of time it takes the clock signal to oscillate once between the first clock state and the second clock state back to the first clock state is generally referred to as a clock period. The latch 36 is configured to receive the clock signal 20, which coordinates the operation of the latch 36. In this example, a clock signal path 38 is split at node 40 into two clock subpaths 38N and 38P. An inverter 42 is provided in the clock subpath 38N, which is a negative side clock subpath. The inverter 42 is operable to invert the clock signal 20 within the clock subpath 38N. No inverter has been provided in the clock subpath 38P, which is a positive side clock subpath. Accordingly, the clock signal 20 is received by the latch 36 as a differential clock signal having a negative side clock signal 20N transmitted on the clock subpath 38N, while a positive side clock signal 20P is provided in the clock subpath 38P.

The latch 36 has a first sampling stage 44 and a first feedback stage 46. Both the first sampling stage 44 and the first feedback stage 46 receive the clock signal 20 (as the negative side clock signal 20N and the positive side clock signal 20P) from the clock signal path 38. The first sampling stage 44 receives a first input bit signal 48 having a first input bit state. For example, the first input bit state could be in a higher voltage state to represent a logical bit value "1." On the other hand, the first input bit state could be in a lower voltage state to represent a logical bit value "0." While the clock signal 20 is in the first clock state, the first sampling stage 44 is configured to sample the first input bit signal 48 and generate a first output bit signal 50 having a first output bit state provided in accordance with the first input bit state. In other words, the latch 36 is transparent while the clock signal 20 is in the first clock state. Depending on the embodiment of the first sampling stage 44, the first sampling stage 44 may be configured to generate the first output bit signal 50 so that the first output bit state is the same as the first input bit state or inverted with respect to the first input bit state. In this example, the first output bit state is inverted with respect to the first input bit state. While the clock signal 20 is in the first clock state, the first output bit signal is received at a storage node 52 with the first output bit state as provided by the first sampling stage 44 while the clock signal 20 is in the first clock state.

Once the clock signal 20 switches to the second clock state, the first feedback stage 46 is activated and the latch 36 is closed. In other words, the first sampling stage 44 becomes opaque and changes to the first input bit state do not affect the first output bit state of the first output bit signal 50. The first feedback stage 46 is configured to drive the first output bit state of the first output bit signal 50 while the clock signal is in the second clock state. However, the first feedback stage 46 is operable in a first feedback mode and a second feedback mode.

When the first feedback stage 46 is in the first feedback mode, the first output bit state of the first output bit signal 50 is held as provided from the first sampling stage 44. For example, if the first output bit state is provided from the first sampling stage 44 to represent a logical bit value "1," the first feedback stage 46 drives the first output bit signal 50 at the storage node 52 to maintain the first output bit signal 50 as representing a logical bit value "1." On the other hand, if the first output bit state is provided from the first sampling stage 44 to represent a logical bit value "0," the first feedback stage 46 drives the first output bit signal 50 at the storage node 52 to maintain the first output bit signal 50 as representing a logical bit value "0."

In contrast, when the first feedback stage 46 is in the second feedback mode, the first output bit state is held in accordance with a majority bit state of a first feedback bit signal 54, a second feedback bit signal 56, and a third feedback bit signal 58. The first feedback bit signal 54 provides feedback for the first output bit signal 50 at the storage node 52. Accordingly, the first feedback bit signal 54 has a first feedback bit state in accordance with the first output bit state of the first output bit signal 50 at the storage node 52. In this example, an inverter 60 is configured to receive the first output bit signal 50 from the first sampling stage 44. More specifically, the inverter 60 is coupled to the storage node 52 to receive the first output bit signal 50. The inverter 60 generates the first feedback bit signal 54, which has a first feedback bit state that is inverted with respect to the first output bit state of the first output bit signal 50.

When the first feedback stage 46 is in the second feedback mode, the second feedback bit signal 56 may be received from a second latch and the third feedback bit signal 58 may be received from a third latch. For example, if the latch 36 is part of or one of the SSEs in the SSC of the pipeline stage 16A shown in FIG. 1, the second feedback bit signal 56 is received from a redundant SSE in the SSC of the pipeline stage 16B. The second feedback bit signal 56 has a second feedback bit state set by the redundant SSE. Analogously, the third feedback bit signal 58 is received from a redundant SSE in the SSC of the pipeline stage 16C. The third feedback bit signal 58 has a third feedback bit state set by the redundant SSE. If the majority (two or more) of the feedback bit states (i.e., the first feedback bit state, the second feedback bit state, and the third feedback bit state) are a logical bit value "1," the majority bit state is a logical bit value "1." In contrast, if the majority of the feedback bit states are a logical bit value "0," the majority bit state is the logical bit value "0." If the first output bit signal 50 at the storage node 52 provides the first feedback bit state as the majority bit state, the first feedback stage 46 maintains the first output bit state of the first output bit signal 50. However, if the first output bit signal 50 at the storage node 52 provides the first feedback bit state opposite to the majority bit state, the first feedback stage 46 drives the first output bit state to the opposite bit state.

In this embodiment, the inverter 60 generates the first feedback bit signal 54 having a feedback bit state that is inverted with respect to the first output bit state of the first output bit signal 50. Accordingly, when the first output bit state of the first output bit signal 50 is a logical bit value "1," the first feedback bit state of the first feedback bit signal 54 is a logical bit value "0." In contrast, when the first output bit state of the first output bit signal 50 is a logical bit value "0," the first feedback bit state of the first feedback bit signal 54 is a logical bit value "1." Thus, this embodiment of the first feedback stage 46 is configured to drive the first output bit state of the first output bit signal 50 as an inverse of the majority bit state of the first feedback bit signal 54, the second feedback bit signal 56, and the third feedback bit signal 58. For instance, if the majority bit state of the feedback bit states is a logical bit value "1" and the first output bit state is a logical bit value "0," the first output bit state is maintained at the storage node 52 at a logical bit value "0." Similarly, if the majority bit state of the feedback bit states is a logical bit value "0" and the first output bit state is a logical bit value "1," the first output bit state is maintained at the storage node 52 at a logical bit value "1." However, if the majority bit state of the feedback bit states is a logical bit value "1" and the first output bit state is a logical bit value "1," the first output bit state is driven at the storage node 52 to the opposite bit value, the logical bit value "0." Similarly, if the majority bit state of the feedback bit states is a logical bit value "0" and the first output bit state is a logical bit value "0," the first output bit state is driven at the storage node 52 to the opposite bit value, the logical bit value "1."

The first feedback stage 46 is thus voter corrected in the second feedback mode since the first output bit state of the first output bit signal 50 is held in accordance with the majority bit state of a first feedback bit signal 54, the second feedback bit signal 56, and the third feedback bit signal 58 when the first feedback stage 46 is in the second feedback mode. To provide an exemplary explanation of the voter correction in the second feedback mode, the latch 36 is again assumed to be part of one of the SSEs in the SSC of the pipeline stage 16A shown in FIG. 1, as explained above. In the second feedback mode each of the pipeline circuits 12 (shown in FIG. 1) can be assumed to be replicating the same behavior. Thus, if the first feedback bit state of the first feedback bit signal 54 is driven to a feedback bit state that is opposite to both the second feedback bit state of the second feedback bit signal 56 and the third feedback bit state of the third feedback bit signal 58, it can be presumed that an error has occurred in the pipeline circuit 12A. For instance, perhaps a radiation strike at the CLC of the pipeline stage 14A caused the CLC to provide incorrect bit states. As a result, an inappropriate bit state is provided to the latch 36.

In this case, the first sampling stage 44 provides the first output bit signal 50 with the incorrect bit state and thus the first feedback bit state of the first feedback bit signal 54 is opposite to the second feedback bit state of the second feedback bit signal 56 and the third feedback bit state of the third feedback bit signal 58. However, in the second feedback mode, the first feedback stage 46 holds the first output bit state in accordance with the majority bit state. When the clock signal 20 was in the first clock state, the first sampling stage 44 provided the first output bit state of the first output bit signal 50 such that the first feedback bit state is in a minority bit state. Accordingly, when the clock signal 20 oscillates into the second clock state, the first feedback stage 46 drives the first output bit state to the opposite bit state, thereby driving the first feedback bits state of the first feedback bit signal 54.

As shown in FIG. 2, the first feedback stage 46 is configured to generate a feedback output bit signal 62 to drive the first output bit state of the first output bit signal 50 while the clock signal 20 is in the second clock state. As explained above, the first feedback stage 46 is operable in the first feedback mode to set the feedback bit state of the first feedback bit signal 54 in accordance with the first output bit state of the first output bit signal 50. Consequently, in the first feedback mode, the first feedback stage 46 simply reinforces the first output bit state of the first output bit signal 50 at the storage node 52. The latch 36 thus operates independently of the other redundant second and third latches in the first feedback mode. On the other hand, in the second feedback mode, the first feedback stage 46 is synchronized with the other latches to provide voter correction. To drive the first output bit state of the first output bit signal 50, the first feedback stage 46 is operable in the second feedback mode to set a feedback output bit state of the feedback output bit signal 62 in accordance with the majority bit state of the first feedback bit signal 54, the second feedback bit signal 56, and the third feedback bit signal 58.

As shown in FIG. 2, the first feedback stage 46 is further configured to receive a feedback mode signal 64. The feedback mode signal 64 is provided at a first signal level to indicate the first feedback mode and at a second signal level to indicate the second feedback mode. Thus, the first feedback stage 46 switches to and from the first feedback mode and the second feedback mode in response to the signal level of the feedback mode signal 64. For example, the first feedback stage 46 operates in the first feedback mode when the feedback mode signal 64 is provided at the first signal level. In contrast, the first feedback stage 46 operates in the second feedback mode when the feedback mode signal 64 is provided at the second signal level.

An inverter 66 is configured to receive the first output bit signal 50 at the storage node 52 and generate a final output bit signal 68. This final output bit signal 68 may be transmitted to a CLC of one of the pipeline stages 14 (shown in FIG. 1). Due to the inversion by the inverter 66, the final output bit state is inverted with respect to the first output bit signal 50. When the first sampling stage 44 is opaque, the final output bit state is isolated from changes in the first input bit state of the first input bit signal 48. In essence, these changes cannot enter the storage node 52 and affect the final output bit state. However, once the clock signal 20 oscillates back into the first clock state, the first sampling stage 44 again becomes transparent. Thus, the first input bit state of the first input bit signal 48 can change the first output bit state of the first output bit signal 50 at the storage node 52. In this manner, valid bit states are passed according to the timing of the clock signal 20.

Embodiments of flip-flops are discussed below. With regard to each of the flip-flops discussed herein, the first clock state of the clock signal 20 is assumed to refer to a clock state in which a slave latch of the flip-flop is transparent while a master latch of the flip-flop is opaque (unless otherwise explicitly noted). Additionally, the second clock state of the clock signal 20 is assumed to refer to a clock state in which the master latch of the flip-flop is transparent while the slave latch of the flip-flop is opaque (unless otherwise explicitly noted). However, these assumptions are non-limiting and are made simply for the purposes of clarity and consistency with regard to the explanation of the embodiments. To underscore that these assumptions are non-limiting, it is explicitly noted that the scope of this disclosure is broad enough to include any type of suitable flip-flop, including single-edge-triggered flip-flops, double-edge-triggered flip-flops, differential flip-flops, static flip-flops, T flip-flops, D flip-flops, JK flip-flops, and/or the like. Furthermore, the first clock state and the second clock state may be any clock state of the clock signal 20 depending on which embodiment of the flip-flop is being discussed.

Figure 3:
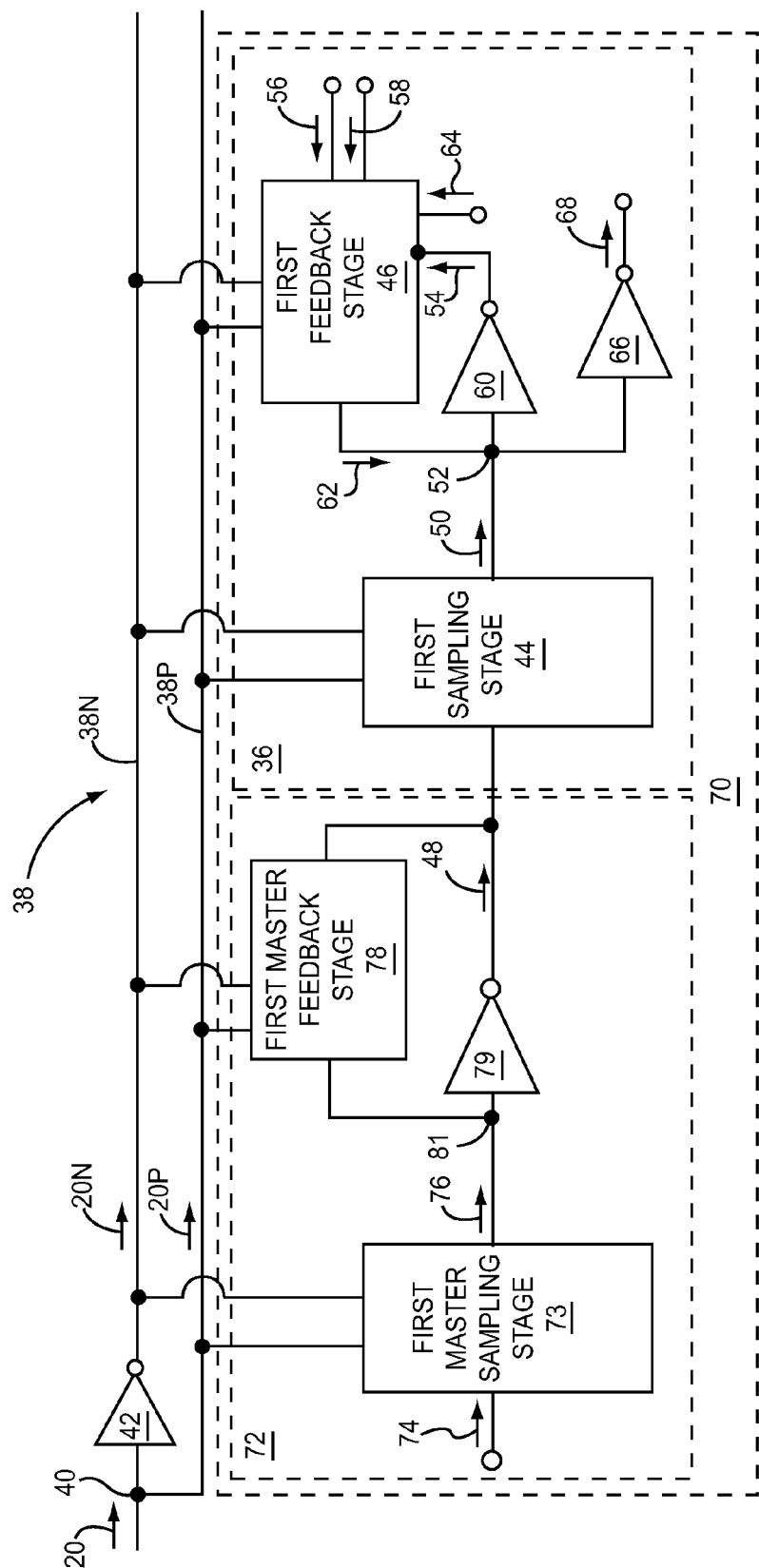
FIG. 3 illustrates a block diagram of an exemplary flip-flop, which is an exemplary SSE that may be utilized within the SSCs shown in FIG. 1.

FIG. 3 is a block diagram of another exemplary SSE, which illustrates one embodiment of a flip-flop 70. The flip-flop 70 has the same latch 36 described above with regard to FIG. 2. However, the flip-flop 70 also includes a master latch 72. The master latch 72 is coupled to the latch 36 so that the latch 36 is a slave latch. The master latch 72 has a first master sampling stage 73 configured to sample an initial input bit signal 74 having an initial input bit state to generate the first input bit signal 48 while the clock signal 20 is in the second clock state. Thus, the master latch 72 is transparent while the latch 36 is opaque. To generate the first input bit signal 48, the first master sampling stage 73 generates an intermediary output bit signal 76. Since an intermediary output bit state of the intermediary output bit signal 76 is based on the initial input bit state, the first input bit state of the first input bit signal 48 is related to the intermediary output bit state of the intermediary output bit signal 76. In this example, the intermediary output bit state and the first input bit state are inverted by an inverter 79. Consequently, in this embodiment, the first input bit signal 48 is an intermediary input bit signal generated by the master latch 72, and the first input bit state of the first input bit signal 48 is an intermediary input bit state.

A first master feedback stage 78 is configured to drive the intermediary output bit state of the intermediary output bit signal 76 such that the intermediary output bit state is held at storage node 81 as provided from the first master sampling stage 73 while the clock signal 20 is in the first clock state. Thus, the master latch 72 is opaque while the (slave) latch 36 is transparent. The master latch 72 thus deraces the path to the latch 36 so that hold time requirements for the latch 36 are more easily met. The flip-flop 70 thus holds two bit state values during the opposite clock states of a clock period: the intermediary output bit state at the storage node 81 and the first output bit state at the storage node 52.

Figure 4:
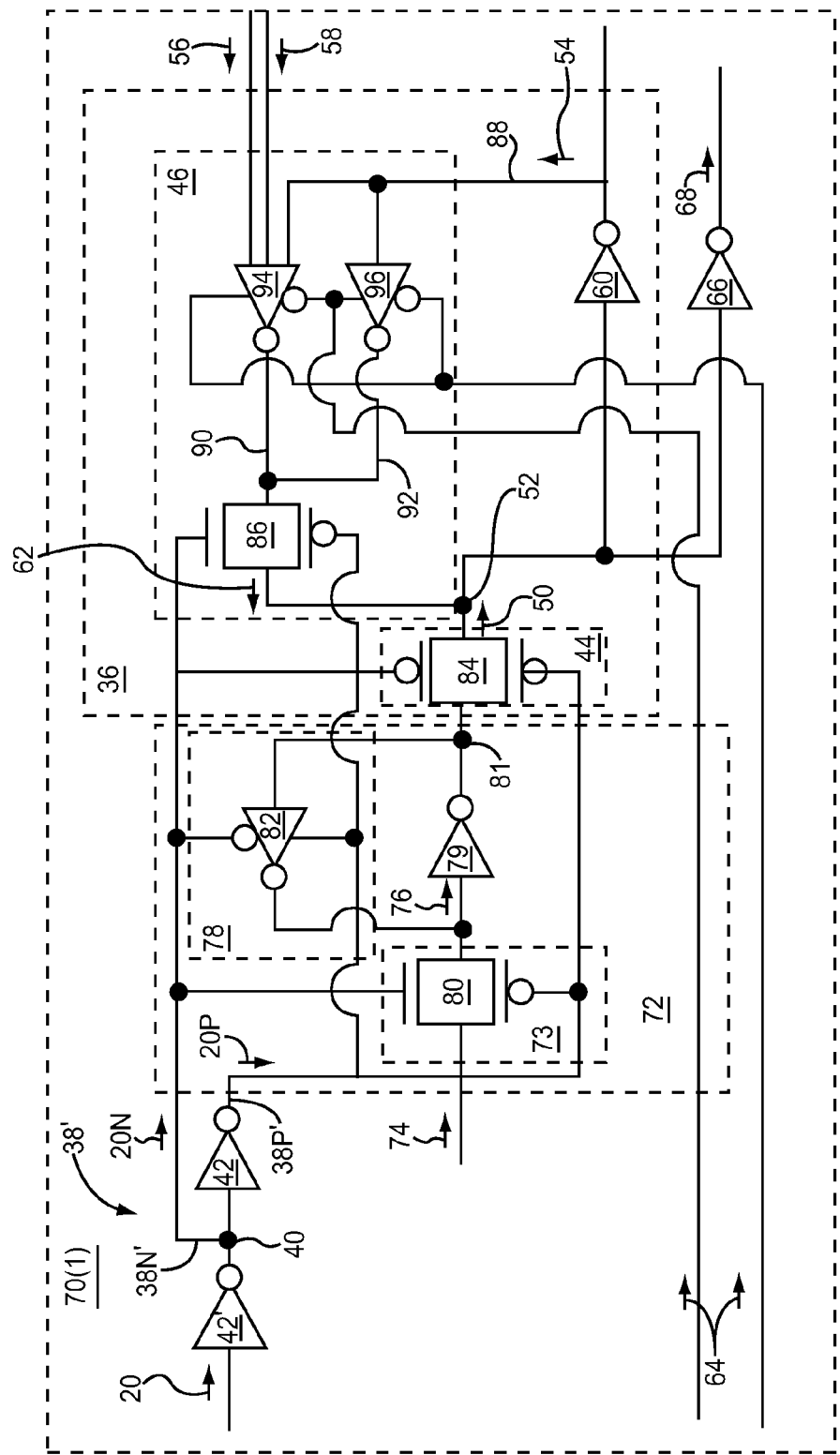
FIG. 4 illustrates a circuit diagram of a flip-flop, which is one embodiment of the flip-flop shown in FIG. 3.

FIG. 4 illustrates a circuit diagram of a flip-flop 70(1). The flip-flop 70(1) is one embodiment of the exemplary flip-flop 70 shown in FIG. 3. The flip-flop 70(1) shown in FIG. 4 also includes a circuit diagram of one embodiment of the latch 36 shown in FIG. 2. In this example, a clock signal path 38' is slightly different from the clock signal path 38 shown in FIGS. 2 and 3. Similar to the clock signal path 38 shown in FIGS. 2 and 3, the clock signal path 38' of FIG. 4 is split at the node 40 into two clock subpaths 38N' and 38P'. The clock signal path 38' also includes the inverter 42. However, in this embodiment, an inverter 42' is provided so that the node 40 is between the inverter 42' and the inverter 42. The inverter 42' is configured to receive the clock signal 20 and generates the negative side clock signal 20N. The negative side clock signal 20N is provided in the clock subpath 38N', which is a negative side clock subpath. In this embodiment, the inverter 42 is provided in the clock subpath 38P', which is a positive side clock subpath. The inverter 42 is operable to invert the negative side clock signal 20N within the clock subpath 38P' so as to generate the positive side clock signal 20P. Accordingly, the clock signal 20 is received by the latch 36 as a differential clock signal having the negative side clock signal 20N transmitted on the clock subpath 38N', while the positive side clock signal 20P is provided in the clock subpath 38P'.

In the master latch 72 shown in FIG. 4, the first master sampling stage 73 is provided by a CMOS transmission gate 80 that is activated when the clock signal 20 is low. The first master feedback stage 78 has a tristate inverter gate 82 that is activated when the clock signal 20 is high. In the latch 36, a CMOS transmission gate 84 provides the first sampling stage 44, which is activated when the clock signal 20 is high. Thus, in this embodiment, the first clock state of the clock signal 20 is high while the second clock state of the clock signal 20 is low.

The first feedback stage 46 has a CMOS transmission gate 86, which activates the first feedback stage 46 when the clock signal 20 is low. As shown in FIG. 4, a feedback path 88 is split off into two branches 90, 92. The first feedback stage 46 includes a majority gate 94 in the first branch 90, which in this example is an inverter majority gate. The second branch 92 includes a tristate gate 96, which in this example is a tristate inverter gate. As shown in FIG. 4, the feedback mode signal 64 is received in this embodiment by the first feedback stage 46 as a differential signal. The feedback mode signal 64 is provided at a first signal level to indicate the first feedback mode and at a second signal level to indicate the second feedback mode.

The first feedback stage 46 is configured to operate in the first feedback mode when the feedback mode signal 64 is provided at the first signal level. To operate in the first feedback mode, the tristate gate 96 shown in FIG. 4 is configured to activate in response to the feedback mode signal 64 being provided at the first signal level. In contrast, the majority gate 94 is configured to deactivate in response to the feedback mode signal 64 being provided at the first signal level. While the clock signal 20 is high and the latch 36 is transparent, the first output bit state of the first output bit signal 50 is set up by the first sampling stage 44 at the storage node 52 with a particular bit state (a logical bit value of either "1" or "0").

Once the clock signal 20 is low and the latch 36 becomes opaque, the tristate gate 96 receives the first feedback bit signal 54 with the first feedback bit state provided in accordance with the first output bit state. Due to the inverter 60, the first feedback bit state is the inverse of the first output bit state. The tristate gate 96 sets the feedback output bit state of the feedback output bit signal 62 only in accordance with the first feedback input bit state of the first feedback bit signal 54. In this example, the tristate gate 96 is a tristate inverter gate and thus the feedback output bit state is set to an inverse of the first feedback input bit state. Consequently, in the first feedback mode, the first feedback stage 46 simply holds the first output bit state at the storage node 52 as it was provided from the first sampling stage 44 while the clock signal 20 is low.

The first feedback stage 46 is also configured to operate in the first feedback mode when the feedback mode signal 64 is provided at the second signal level. To operate in the second feedback mode, the majority gate 94 shown in FIG. 4 is configured to activate in response to the feedback mode signal 64 being provided at the second signal level. In contrast, the tristate gate 96 is configured to deactivate in response to the feedback mode signal 64 being provided at the second signal level. Once the clock signal 20 is low and the latch 36 becomes opaque, the majority gate 94 receives the first feedback bit signal 54 with the first feedback bit state, the second feedback bit signal 56 with the second feedback bit state, and the third feedback bit signal 58 with the third feedback bit state. The majority gate 94 sets the feedback output bit state in accordance with the majority bit state of the first feedback bit signal 54, the second feedback bit signal 56, and the third feedback bit signal 58. In this example, the majority gate 94 is an inverse majority gate and thus the feedback output bit state is set to an inverse of the majority bit state. Consequently, in the second feedback mode, the first feedback stage 46 holds the first output bit state at the storage node 52 as the inverse of the majority bit state while the clock signal 20 is low.

Figure 5:
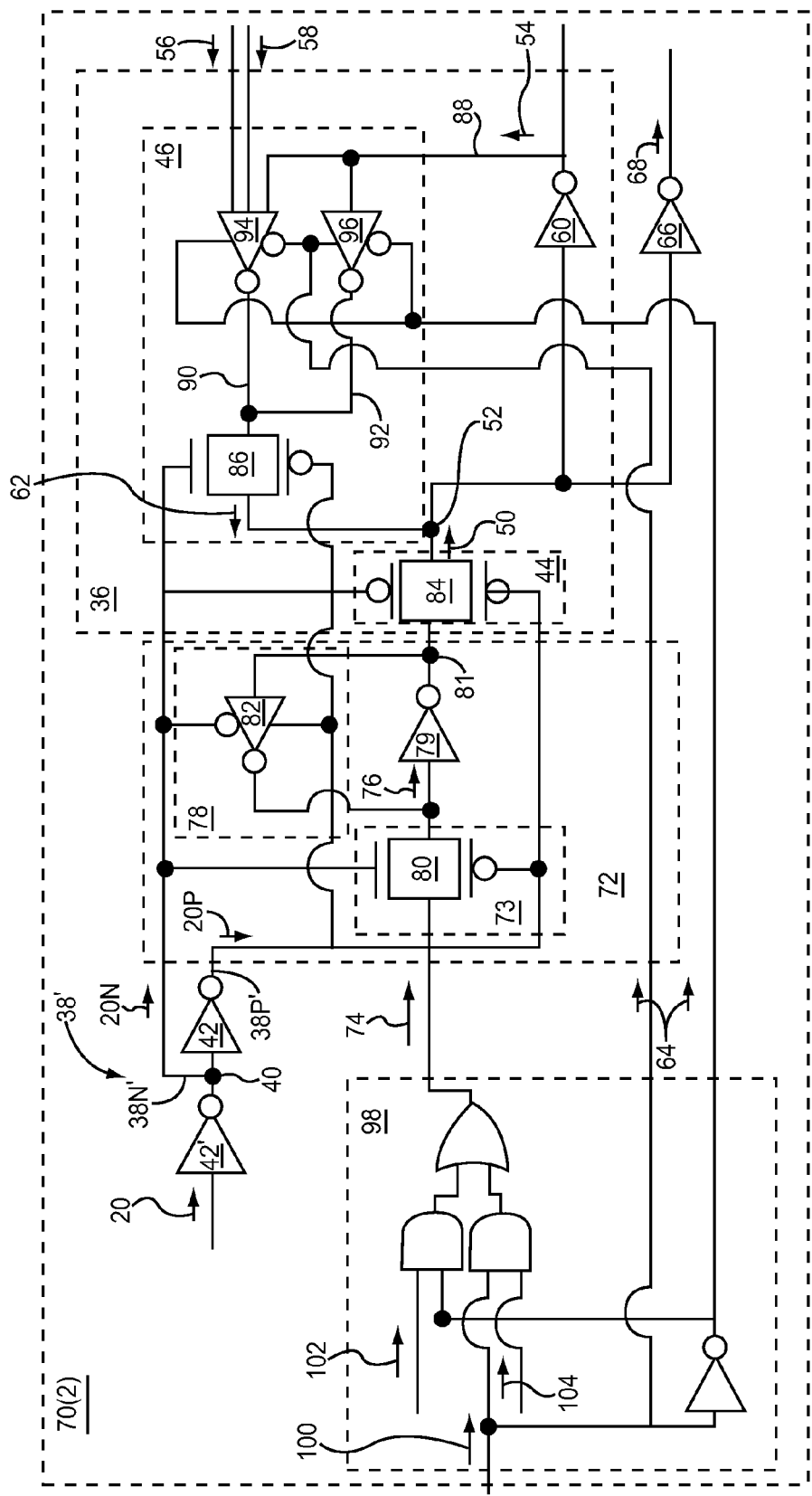
FIG. 5 illustrates a circuit diagram of another flip-flop, which is another embodiment of the flip-flop shown in FIG. 3.

FIG. 5 illustrates a circuit diagram of another embodiment of a flip-flop 70(2), which may be provided as one of the SSEs shown in FIG. 1. The flip-flop 70(2) is another embodiment of the flip-flop 70 shown in FIG. 3. The flip-flop 70(2) is the same as the flip-flop 70(1) shown in FIG. 4, except that the flip-flop 70(2) includes a first multiplexer 98, which is configured to provide the initial input bit signal 74. In order to generate the initial input bit signal 74, the first multiplexer 98 is configured to receive a multiplexer select signal 100, a first data input bit signal 102, and a second data input bit signal 104. Either the first data input bit signal 102 or the second data input bit signal 104 is provided by the first multiplexer 98 as the initial input bit signal 74. More specifically, the first multiplexer 98 is configured to select between the first data input bit signal 102 and the second data input bit signal 104 as the initial input bit signal in response to the multiplexer select signal 100. For example, if the multiplexer select signal 100 is provided in a multiplexer select signal state, the first data input bit signal 102 is selected as the initial input bit signal 74. On the other hand, if the multiplexer select signal 100 is provided in an opposite multiplexer select signal state, the second data input bit signal 104 is provided as the initial input bit signal 74.

Note that in this embodiment, the first feedback stage 46 in the latch 36 is configured to receive the multiplexer select signal 100 as the feedback mode signal 64. In this embodiment, the first data input bit signal 102 is a data line bit signal. For example, if the flip-flop 70(2) is one of the SSEs in the SSC of the pipeline stage 16A shown in FIG. 1, the first data input bit signal 102 may be one of the input bit signals of the data input 26A from the CLC of the pipeline stage 14A. The second data input bit signal 104 in this embodiment is a scan mode bit signal. The multiplexer select signal 100 is a scan enable signal. When scan enable signal is in a scan enable state, the majority gate 94 is deactivated and the tristate gate 96 is activated so that the first feedback stage 46 operates in the first feedback mode. The second data input bit signal 104 (the scan mode bit signal) in this embodiment is provided by the first multiplexer 98 as the initial input bit signal 74. On the other hand, when the scan enable signal is in a scan disenable state, the tristate gate 96 is deactivated and the majority gate 94 is activated so that the first feedback stage 46 operates in the second feedback mode. Accordingly, this configuration allows scan mode decoupling of pipeline stages when the scan enable signal is in the scan enable state. In this manner, the pipeline stages can be tested for defects.

Figure 6:
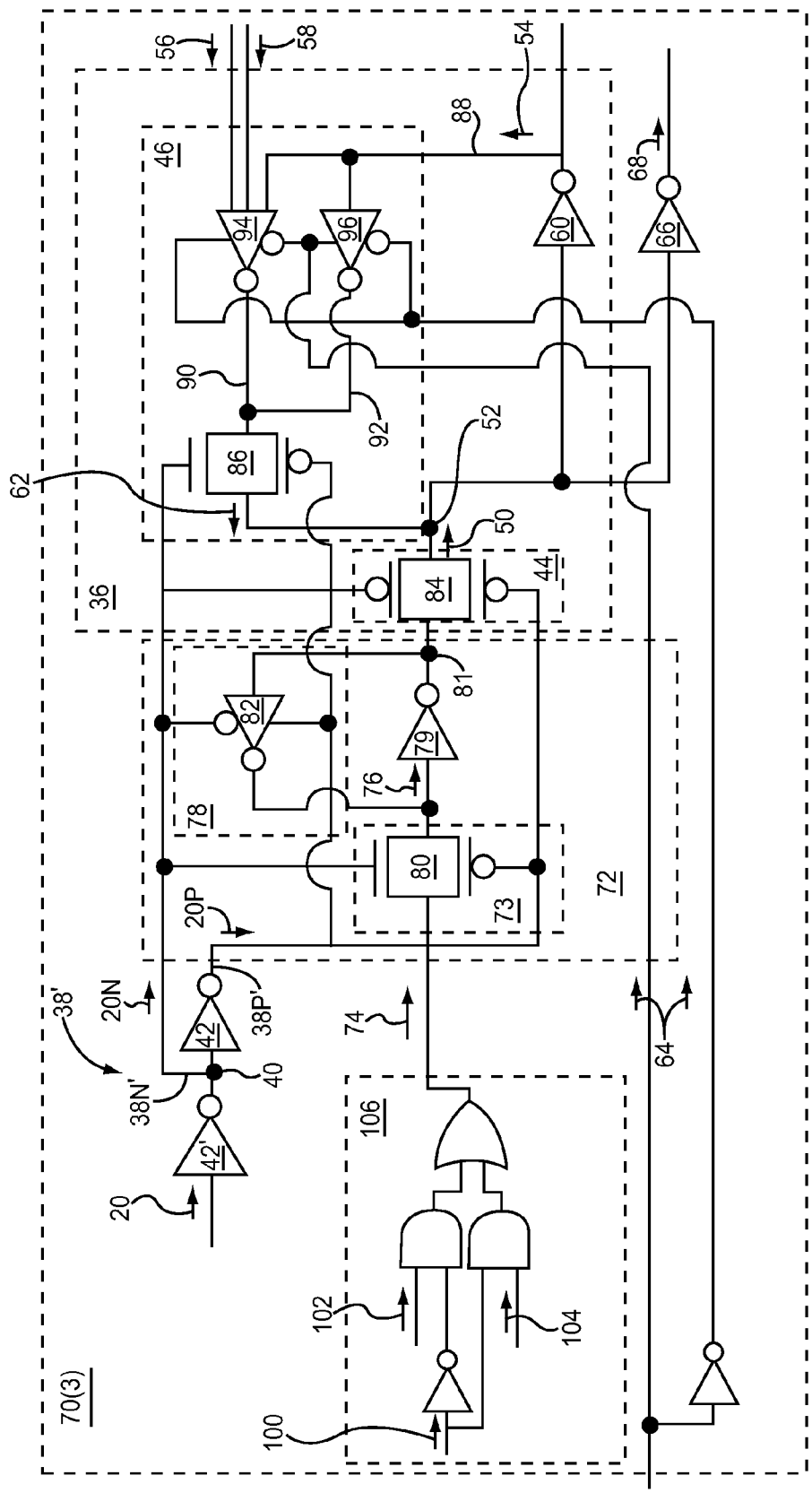
FIG. 6 illustrates a circuit diagram of yet another flip-flop, which is yet another embodiment of the flip-flop shown in FIG. 3.

FIG. 6 illustrates a circuit diagram of another embodiment of a flip-flop 70(3), which may be provided as one of the SSEs shown in FIG. 1. The flip-flop 70(3) is still another embodiment of the exemplary flip-flop 70 shown in FIG. 3. In FIG. 6, the flip-flop 70(3) is the same as the flip-flop 70(2) shown in FIG. 5, except that the flip-flop 70(3) has a different embodiment of a first multiplexer 106. Unlike the first multiplexer 98 shown in FIG. 5, the first multiplexer 106 of FIG. 6 is configured to receive the multiplexer select signal 100 and the feedback mode signal 64 as separate signals.

Accordingly, in this embodiment, the majority gate 94 can be deactivated and the tristate gate 96 can be activated while the first multiplexer 106 still provides the initial input bit signal 74 as the first data input bit signal 102. Additionally, the majority gate 94 can be deactivated and the tristate gate 96 can be activated while the first multiplexer 106 provides the initial input bit signal 74 as the second data input bit signal 104. Thus, this configuration of the flip-flop 70(3) may be utilized to allow the pipeline circuits 12 (shown in FIG. 1) to operate with each other as redundant state machines, to allow each of the pipeline circuits 12 to operate as independent state machines, and to allow for scan testing. For example, when the first feedback stage 46 operates in the second feedback mode, the majority gate 94 is activated and the tristate gate 96 is deactivated. The flip-flop 70(3) would operate in this manner when the pipeline circuits 12 (shown in FIG. 1) are operating as redundant state machines.

On the other hand, if the first feedback stage 46 operates in the first feedback mode, the majority gate 94 is deactivated and the tristate gate 96 is activated. Still, the first multiplexer 106 can provide the initial input bit signal 74 as the first data input bit signal 102 because the multiplexer select signal 100 is independent of the feedback mode signal 64 and scan testing can still be disabled. The flip-flop 70(3) would operate in this manner when the pipeline circuits 12 are operating as independent state machines. However, the first multiplexer 106 can also provide the initial input bit signal 74 as the second data input bit signal 104 when the first feedback stage 46 is in the second feedback mode. The flip-flop 70(3) would operate in this manner to provide for scan mode decoupling.

Figure 7:
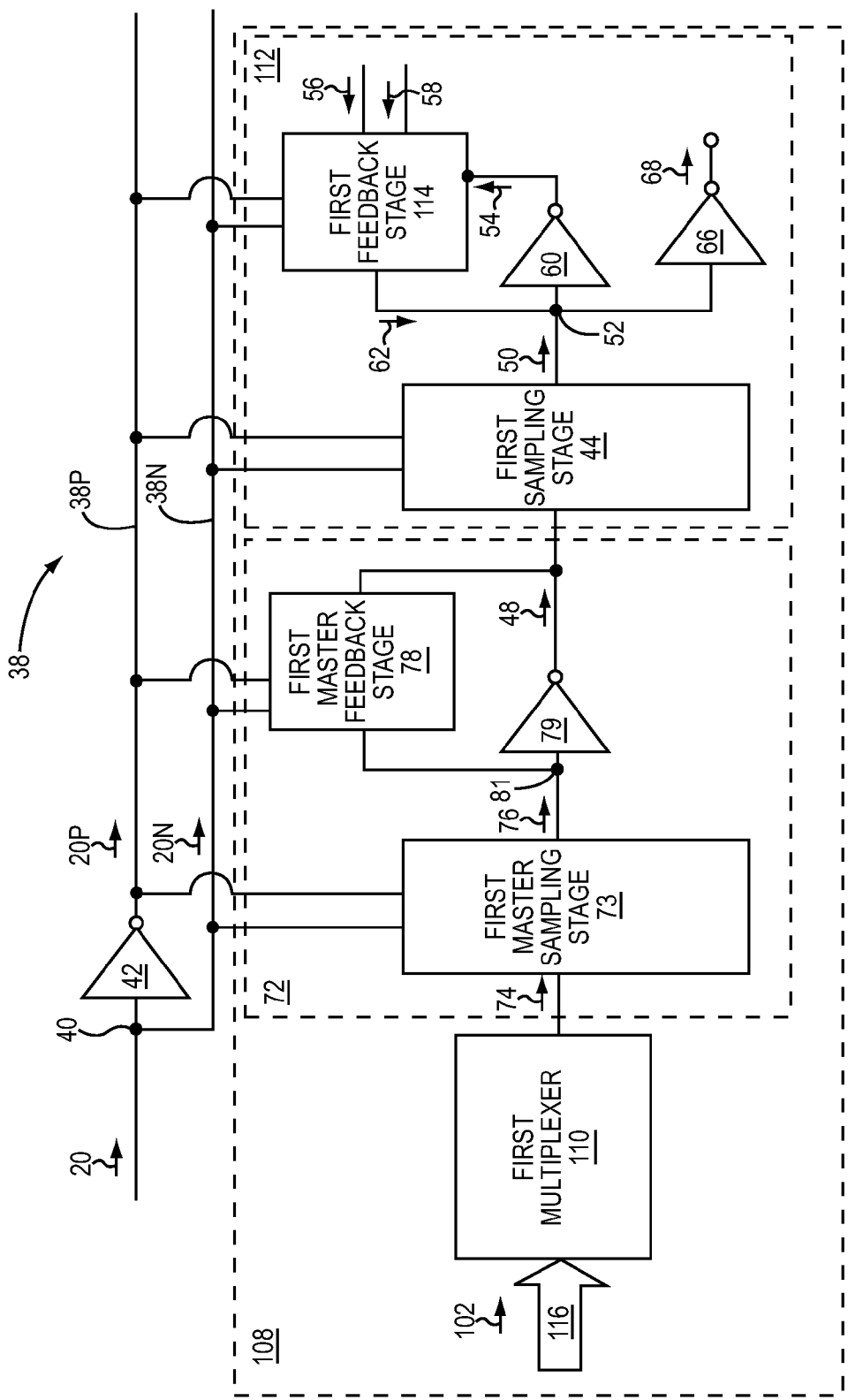
FIG. 7 illustrates a block diagram of an exemplary flip-flop, which is an exemplary SSE that may be utilized within the SSCs shown in FIG. 1.

FIG. 7 illustrates another embodiment of an exemplary SSE, which in this example is a flip-flop 108. In this embodiment, the flip-flop 108 includes the same master latch 72 described above with respect to the flip-flop 70 described above with regard to FIG. 3. The master latch 72 shown in FIG. 7 thus includes the first master sampling stage 73, the first master feedback stage 78, the inverter 79, and the storage node 81 described above. Consequently, the initial input bit signal 74, the intermediary output bit signal 76, and the first input bit signal 48 are received and/or generated by the master latch 72 in the same manner described above with respect to the flip-flop 70 shown in FIG. 3. The first input bit signal 48 is thus an intermediary input bit signal generated by the master latch 72 and the first input bit state of the first input bit signal 48 is an intermediary input bit state.

The flip-flop 108 includes an exemplary first multiplexer 110 and an exemplary slave latch 112. In this embodiment, the slave latch 112 is the same as the latch 36 described with regard to FIGS. 2 and 3 except that the slave latch 112 includes a different embodiment of a first feedback stage 114. More specifically, the slave latch 112 includes the first sampling stage 44, the storage node 52, the inverter 60, and the inverter 66 described with respect to the latch 36 shown in FIGS. 2 and 3. The first output bit signal 50, the first feedback bit signal 54, the second feedback bit signal 56, the third feedback bit signal 58, and the final output bit signal 68 are received and/or generated by the first sampling stage 44, the storage node 52, the inverter 60, and the inverter 66 in the same manner described above with respect to the latch 36 shown in FIGS. 2 and 3. However, in this embodiment, the slave latch 112 includes the first feedback stage 114. While the first feedback stage 114 is similar to the first feedback stage 46 described above with regard to FIGS. 2 and 3, the first feedback stage 114 does not receive the feedback mode signal 64 (shown in FIG. 3). Also, when the first feedback stage 114 is activated, the first feedback stage 114 operates in the same manner as the first feedback stage 46 when the first feedback stage 46 was in the second feedback mode, but the first feedback stage 114 is not operable in the first feedback mode. In other words, the first feedback stage 114 shown in FIG. 7 does not have a feedback mode where the first output bit state of the first output bit signal 50 is simply held as provided from the first sampling stage 44 and is unresponsive to the second feedback bit signal 56 and the third feedback bit signal 58. Rather, the first feedback stage 114 is configured to hold the first output bit state of the first output bit signal 50 in accordance with the majority bit state of the first feedback bit signal 54, the second feedback bit signal 56, and the third feedback bit signal 58.

The first multiplexer 110 is operable to generate the initial input bit signal 74, which is received by the first master sampling stage 73 of the master latch 72. In this embodiment, the first multiplexer 110 receives the first data input bit signal 102 (described above in FIG. 5) and a first multiplexer output selection input 116. The first data input bit signal 102 is the data line bit signal generated by the CLC in the previous pipeline stage (e.g., the CLC in the pipeline stage 14A shown in FIG. 1, assuming the flip-flop 108 is one of the SSEs in the SSC of the pipeline stage 16A shown in FIG. 1). The first multiplexer output selection input 116 may include one or more multiplexer test mode bit signals. For example, the first multiplexer output selection input 116 may include one or more test bit signals, scan enable bit signals, multiplexer select bit signals, and/or any other type of bit signal related to selecting bit states to be input/output from SSEs. To generate the initial input bit signal 74, the first multiplexer 110 is configured to select between setting the initial input bit state to a first logical bit value (e.g., a logical bit value "1" or "0"), setting the initial input bit state to a second logical bit value that is opposite the first logical bit value (e.g., whichever logical bit value ("0" or "1") is opposite to the first logical bit value), and setting the initial input bit state in accordance with the first data input bit state of the first data input bit signal 102 in response to the first multiplexer output selection input 116. If the first logical bit value is "1," the second logical bit value is "0." In contrast, if the first logical bit value is "0," the second logical bit value is "1."

In one embodiment, the first multiplexer output selection input 116 is bound to a group of selection states. The group of selection states includes at least a first selection state, a second selection state, and a third selection state. Each of the selection states in the group of selection states indicates a different selection to be made by the first multiplexer 110. For example, the first multiplexer 110 is configured to select that the initial input bit state be set to the first data input bit state of the first data input bit signal 102 in response to the first multiplexer output selection input 116 being provided in the first selection state. The first multiplexer output selection input 116 may be provided in the first selection state during normal operation. However, as explained in further detail below, in some embodiments, the first multiplexer output selection input 116 may also be provided in the first selection state while testing a pipeline stage (e.g., the pipeline stage 14A shown in FIG. 1). The first multiplexer 110 is configured to select that the initial input bit state be set to the first logical bit value in response to the first multiplexer output selection input 116 being provided in the second selection state. The first multiplexer 110 is unresponsive to the first data input bit signal 102 and any other data bit signal in response to the first multiplexer output selection input being provided in the second selection state. Instead, the first multiplexer 110 is configured to force the initial input bit state to be the first logical bit value (e.g., a logical bit value "1") when the first multiplexer output selection input 116 is provided in the second selection state. As explained in further detail below, the first multiplexer output selection input 116 may be provided in the second selection state while testing another redundant pipeline stage (e.g., the pipeline stage 14B or the pipeline stage 14C shown in FIG. 1). The first multiplexer 110 is configured to select that the initial input bit state be set to the second logical bit value that is opposite the first logical bit value in response to the first multiplexer output selection input 116 being provided in the third selection state. The first multiplexer 110 is also unresponsive to the first data input bit signal 102 and any other data bit signal in response to the first multiplexer output selection input 116 being provided in the third selection state. Instead, the first multiplexer 110 is configured to force the initial input bit state to be the second logical bit value (e.g., a logical bit value "0") when the first multiplexer output selection input 116 is provided in the third selection state. As explained in further detail below, the first multiplexer output selection input 116 may be provided in the third selection state while testing another redundant pipeline stage (e.g., the pipeline stage 14B or the pipeline stage 14C shown in FIG. 1).

Referring now to FIG. 1 and FIG. 7, the first multiplexer 110 thus allows for redundant pipeline stages in a TMRPS to be tested without requiring the first feedback stage 114 to be operable in the first feedback mode described above for the first feedback stage 46 in FIGS. 2 and 3. To provide an explicatory example, the flip-flop 108 may be one of the SSEs in the SSC of the pipeline stage 16A. It is also presumed that a TMRSSE is formed with the flip-flop 108, one of the SSEs (assumed to be identical to the flip-flop 108) in the SSC of the pipeline stage 16B, and one of the SSEs (assumed to be identical to the flip-flop 108) in the SSC of the pipeline stage 16C. In this example, the SSE (assumed to be identical to the flip-flop 108) of the TMRSSE of the pipeline stage 16B is assumed to generate the second feedback bit signal 56 while the SSE (assumed to be identical to the flip-flop 108) in the SSC of the pipeline stage 16C is assumed to generate the third feedback bit signal 58. During normal operation of the TMRPS PS1 (shown in FIG. 1), the initial input bit state of the initial input bit signal 74 for the flip-flop 108 is selected to be the first data input bit signal 102, which is generated by the CLC in the pipeline stage 14A. Additionally, initial input bit states of initial input bit signals to the SSEs of the TMRSSE in the SSCs of the pipeline stages 16B, 16C are selected to be the data input bit signals generated by the corresponding CLCs in the pipeline stages 14B, 14C.

However, in this exemplary embodiment, if the CLC in the pipeline stage 14A in the TMRPS PS1 is to be tested, the initial input bit state of the initial input bit signal 74 is selected to be the first data input bit signal 102 for the flip-flop 108, the initial input bit state of the initial input bit signal 74 to the SSEs in the SSC of the pipeline stage 16B is selected to be the first logical bit value, and the initial input bit state of the initial input bit signal 74 to the SSEs of the TRSSE in the SSC of the pipeline stage 16C is selected to be the second logical bit value, which is opposite the first logical bit value. As such, the majority bit state of the first feedback bit signal 54, the second feedback bit signal 56, and the third feedback bit signal 58 is determined by the first data input bit signal 102 generated by the CLC in the pipeline stage 14A. If the first input bit state of the first input bit state of the first input bit signal is incorrect, then an error has occurred at the CLC of the pipeline stage 14A. Thus, the CLC in the pipeline stage 14A can be tested. The CLCs in the pipeline stages 14B and 14C can be tested in an analogous manner. For example, when the CLC in the pipeline stage 14B is being tested, the initial input bit state of the initial input bit signal 74 to the flip-flop 108 in the SSC of the pipeline stage 16A may be selected to be the first logical bit value while the initial input bit state of the initial input bit signal (not shown) to the SSE in the SSC of the pipeline stage 16C may be selected to be the second logical bit value. In this case, the initial input bit state of the initial input bit signal to the SSE in the SSC of the pipeline stage 16B is selected to be set in accordance with the data input bit signal generated by the CLC of the pipeline stage 14B. When the CLC in the pipeline stage 14C is being tested, the initial input bit state of the initial input bit signal 74 to the flip-flop 108 in the SSC of the pipeline stage 16A may be selected to be the second logical bit value, while the initial input bit state of the initial input bit signal to the SSE in the SSC of the pipeline stage 16B may be selected to be the first logical bit value. In this case, the initial input bit state of the initial input bit signal (not shown) to the SSE in the SSC of the pipeline stage 16C is selected to be set in accordance with the data input bit signal generated by the CLC of the pipeline stage 14C. The flip-flop 108 may thus have a simplified design without requiring expensive or overly specialized circuitry to allow for testing.

Referring again to FIG. 7, the first feedback bit signal 54 provides feedback for the first output bit signal 50 at the storage node 52, as discussed above. Accordingly, the first feedback bit state of the first feedback bit signal 54 is provided in accordance with the first output bit state of the first output bit signal 50 at the storage node 52. More specifically, the inverter 60 is coupled to the storage node 52 and receives the first output bit signal 50 from the first sampling stage 44. In this embodiment, the inverter 60 generates the first feedback bit signal 54 and thus the first feedback bit state that is inverted with respect to the first output bit state of the first output bit signal 50.

The second feedback bit signal 56 and the third feedback bit signal 58 may be received from a third redundant flip-flop. In accordance with the explicatory example described above, if the slave latch 112 is part of or one of the SSEs in the SSC of the pipeline stage 16A shown in FIG. 1, the second feedback bit signal 56 is received from a redundant SSE in the SSC of the pipeline stage 16B. The second feedback bit state of the second feedback bit signal 56 is thus set by the redundant SSE. Analogously, the third feedback bit signal 58 is received from a redundant SSE in the SSC of the pipeline stage 16C. The third feedback bit state of the third feedback bit signal 58 is thus set by the redundant SSE. If the majority (two or more) of the feedback bit states (i.e., the first feedback bit state, the second feedback bit state, and the third feedback bit state) are a logical bit value "1," the majority bit state is a logical bit value "1." In contrast, if the majority of the feedback bit states are a logical bit value "0," the majority bit state is a logical bit value "0." If the first output bit signal 50 at the storage node 52 provides the first feedback bit state as the majority bit state, the first feedback stage 114 maintains the first output bit state of the first output bit signal 50. However, if the first output bit signal 50 at the storage node 52 provides the first feedback bit state opposite to the majority bit state, the first feedback stage 114 drives the first output bit state to the opposite bit state.

In this embodiment, the inverter 60 generates the first feedback bit signal 54 having a feedback bit state that is inverted with respect to the first output bit state of the first output bit signal 50. Accordingly, when the first output bit state of the first output bit signal 50 is a logical bit value "1," the first feedback bit state of the first feedback bit signal 54 is a logical bit value "0." In contrast, when the first output bit state of the first output bit signal 50 is a logical bit value "0," the first feedback bit state of the first feedback bit signal 54 is a logical bit value "1." Thus, this embodiment of the first feedback stage 114 is configured to drive the first output bit state of the first output bit signal 50 as an inverse of the majority bit state of the first feedback bit signal 54, the second feedback bit signal 56, and the third feedback bit signal 58. For instance, if the majority bit state of the feedback bit states is a logical bit value "1" and the first output bit state is a logical bit value "0," the first output bit state is maintained at the storage node 52 at a logical bit value "0." Similarly, if the majority bit state of the feedback bit states is a logical bit value "0" and the first output bit state is a logical bit value "1," the first output bit state is maintained at the storage node 52 at a logical bit value "1." However, if the majority bit state of the feedback bit states is a logical bit value "1" and the first output bit state is a logical bit value "1," the first output bit state is driven at the storage node 52 to the opposite logical bit value "0." Similarly, if the majority bit state of the feedback bit states is a logical bit value "0" and the first output bit state is a logical bit value "0,"
the first output bit state is driven at the storage node 52 to the opposite, a logical bit value "1."

When the slave latch 112 is transparent, the first feedback stage 114 is deactivated. On the other hand, when the slave latch 112 is opaque, the first feedback stage 114 is activated and the first feedback stage 114 is voter corrected since the first output bit state of the first output bit signal 50 is held in accordance with the majority bit state of the first feedback bit signal 54, the second feedback bit signal 56, and the third feedback bit signal 58. To provide an exemplary explanation of the voter correction, the slave latch 112 is again assumed to be part of one of the SSEs in the SSC of the pipeline stage 16A shown in FIG. 1, as explained above. Thus, if the first feedback bit state of the first feedback bit signal 54 is driven to a feedback bit state that is opposite to both the second feedback bit state of the second feedback bit signal 56 and the third feedback bit state of the third feedback bit signal 58, it can be presumed that an error has occurred in the pipeline circuit 12A. For instance, a radiation strike at the CLC of the pipeline stage 14A may have caused the CLC to provide incorrect bit states. As a result, an inappropriate bit state is provided to the slave latch 112.

In this case, the first sampling stage 44 provides the first output bit signal 50 with the incorrect bit state and thus the first feedback bit state of the first feedback bit signal 54 is opposite to the second feedback bit state of the second feedback bit signal 56 and the third feedback bit state of the third feedback bit signal 58. However, the first feedback stage 114 holds the first output bit state in accordance with the majority bit state. When the clock signal 20 is in the first clock state, the first sampling stage 44 provides the first output bit state of the first output bit signal 50 such that the first feedback bit state is in a minority bit state. Accordingly, when the clock signal 20 oscillates into the second clock state, the first feedback stage 114 is activated and drives the first output bit state to the opposite bit state, thereby driving the first feedback bit state of the first feedback input bit signal 54 to the majority bit state.

Like the first feedback stage 46 shown in FIGS. 2 and 3, the first feedback stage 114 shown in FIG. 7 is configured to generate the feedback output bit signal 62 to drive the first output bit state of the first output bit signal 50 while the clock signal 20 is in the second clock state. However, the first feedback stage 114 is not operable in the first feedback mode, but rather always operates in the same manner as the first feedback stage 46 in the second feedback mode when the first feedback stage 114 is activated. Accordingly, to drive the first output bit state of the first output bit signal 50, the first feedback stage 114 is operable to set the feedback output bit state of the feedback output bit signal 62 in accordance with the majority bit state of the first feedback bit signal 54, the second feedback bit signal 56, and the third feedback bit signal 58. As explained above, the first feedback stage 114 is synchronized with the other slave latches of the redundant flip-flops to provide voter correction.

Nevertheless, by selecting the initial input bit state of the initial input bit signal 74, the first multiplexer 110 selects how the first feedback bit state of the first feedback bit signal 54 is set up in the slave latch 112 so that the flip-flop 108 can be used during testing. To do this, the first multiplexer 110 and the first feedback stage 114 are operably associated such that the first feedback bit state of the first feedback bit signal 54 is set up in accordance with the initial input bit state of the initial input bit signal 74. More specifically, the first multiplexer 110 and the first feedback stage 114 are operably associated by the master latch 72 and the first sampling stage 44. This allows for the first multiplexer 110 to select how the first feedback bit state of the first feedback bit signal 54 is set up when the slave latch 112 is transparent in the first clock state of the clock signal 20.

The master latch 72 is configured to generate the first input bit signal 48, which is received by the first sampling stage 44 of the slave latch 112. Since the inverter 79 of the master latch 72 is configured to generate the first input bit signal 48 from the intermediary output bit signal 76, the first input bit state of the first input bit signal 48 is set in accordance with the intermediary output bit state of the intermediary output bit signal 76. In this example, the intermediary output bit state and the first input bit state are inverted with respect to one another.

To generate the intermediary output bit signal 76 (and thus the first input bit signal 48) while the clock signal 20 is in the second clock state, the first master sampling stage 73 of the master latch 72 is configured to sample the initial input bit signal 74, as discussed above. As a result, the master latch 72 sets the intermediary output bit state of the intermediary output bit signal 76 at the storage node 81 in accordance with the initial input bit state of the initial input bit signal 74 while the clock signal 20 is in the second clock state. The first input bit state of the first input bit signal 48 is thus set up in accordance with the initial input bit state of the initial input bit signal 74 during the second clock state of the clock signal 20. To generate the intermediary output bit signal 76 (and thus the first input bit signal 48) while the clock signal 20 is in the first clock state, the first master feedback stage 78 is configured to hold the intermediary output bit state of the intermediary output bit signal 76, as discussed above. Therefore, the first input bit state of the first input bit signal 48 is also held in accordance with the initial input bit state of the initial input bit signal 74 while the clock signal 20 is in the first clock state.

The first sampling stage 44 of the slave latch 112 is also configured to sample the first input bit signal 48 while the clock signal 20 is in the first clock state. The first sampling stage 44 thus generates the first output bit signal 50 having the first output bit state provided in accordance with the first input bit state of the first input bit signal 48. Since the storage node 52 of the slave latch 112 is coupled to receive the first output bit signal from the first sampling stage 44 and since the first input bit state of the first input bit signal 48 is set and held in accordance with the initial input bit state of the initial input bit signal 74 by the master latch 72, the first output bit state of the first output bit signal 50 is set up with the initial input bit state of the initial input bit signal 74 while the clock signal 20 is in the first clock state by the slave latch 112. The first feedback bit signal 54 is feedback for the first output bit signal 50 to the first feedback stage 114, and thus the first feedback bit state of the first feedback bit signal 54 is provided in accordance with the first output bit state of the first output bit signal 50. Therefore, the first feedback bit state of the first feedback input bit signal 54 is also set up in accordance with the initial input bit state of the initial input bit signal 74 while the clock signal 20 is in the first clock state. In this embodiment, the first feedback input bit signal 54 is generated by the inverter 60 from the first output bit signal 50, and thus the first feedback bit state and the first output bit state are inverted. Once the clock signal 20 again oscillates back into the second clock state, the slave latch 112 becomes opaque and the first feedback stage 114 is activated. Thus, initially, the first feedback bit state is provided to the first feedback stage 114 as set up in accordance with the initial input bit state of the initial input bit signal 74. The first feedback stage 114 drives the first output bit state of the first output bit signal 50 at the storage node 52 in accordance with the majority bit state. Therefore, the first feedback bit state of the first feedback input bit signal 54 is also driven in accordance with the majority bit state when the first feedback stage 114 is active and the slave latch is opaque. However, setting up the first feedback bit state (along with the second feedback bit state of second feedback bit signal 56 and the third feedback bit state of the third feedback bit signal 58) can be controlled by the first multiplexer 110 (along with the multiplexers in the redundant SSEs). This allows for a test control circuit to determine how the majority bit state is to be determined.

Figure 8:
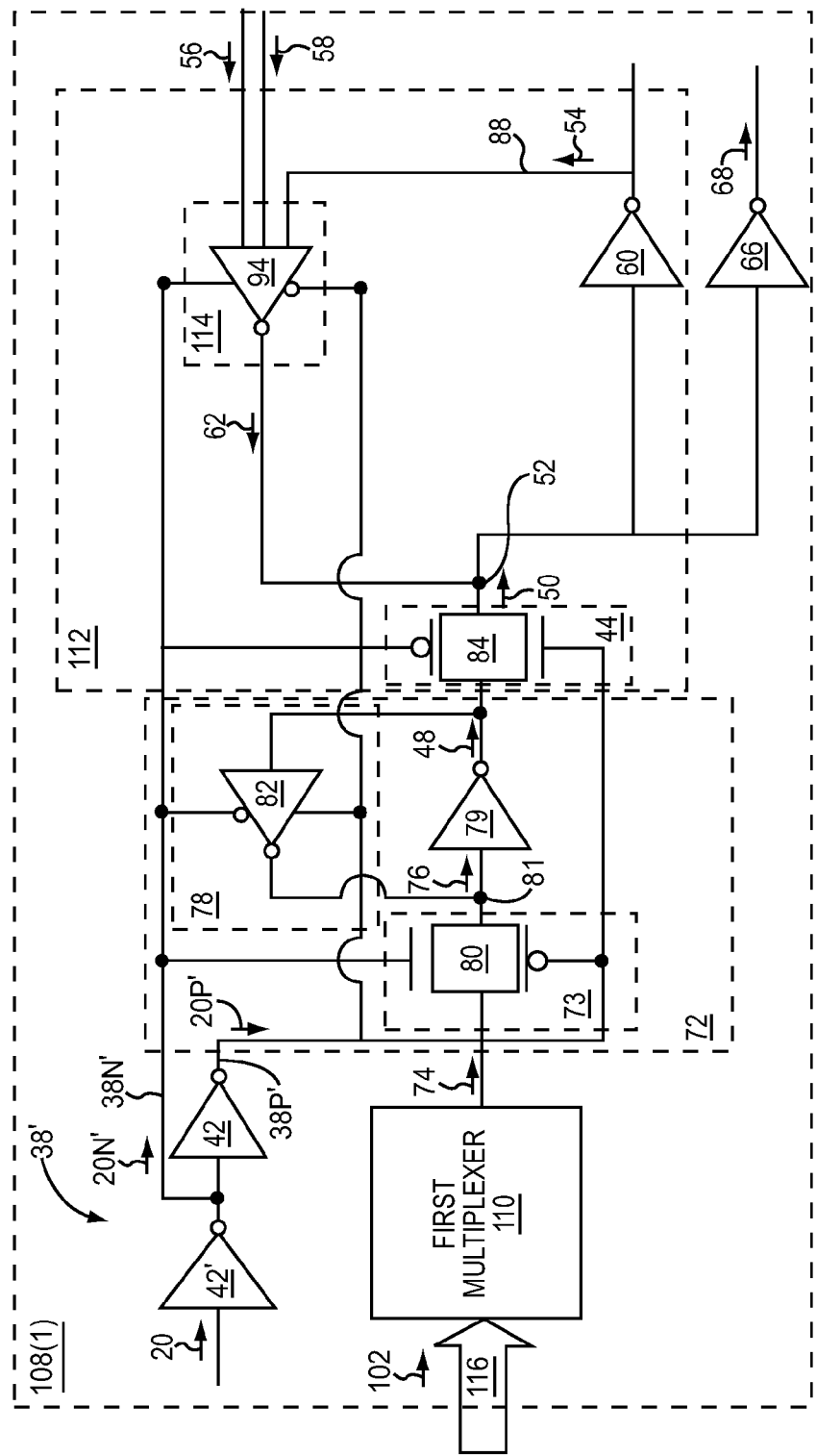
FIG. 8 illustrates a circuit diagram of a flip-flop, which is one embodiment of the flip-flop shown in FIG. 7.

FIG. 8 illustrates a circuit diagram of a flip-flop 108(1). The flip-flop 108(1) is one embodiment of the exemplary flip-flop 108 shown in FIG. 7. The flip-flop 108(1) has the same master latch 72 shown in FIG. 4. FIG. 8 also includes a circuit diagram of one embodiment of the slave latch 112 shown in FIG. 7. The slave latch 112 is the same as the latch 36 shown in FIG. 4, except that the slave latch 112 includes the first feedback stage 114. A circuit diagram of the first feedback stage 114 is also shown in FIG. 8. Furthermore, the flip-flop 108(1) includes the first multiplexer 110 shown in FIG. 7, which is configured to receive the first data input bit signal 102 and the first multiplexer output selection input 116.

Like the first feedback stage 46 shown in FIG. 4, the first feedback stage 114 of FIG. 8 includes the majority gate 94 and the feedback path 88. However, the first feedback stage 114 does not include the CMOS transmission gate 86 (shown in FIG. 4) or the tristate gate 96 (shown in FIG. 4), and the feedback path 88 of FIG. 8 does not split into the two branches 90 and 92 (shown in FIG. 4), but is provided as a single branch. The majority gate 94 is coupled within the feedback path 88 and is configured to receive the first feedback bit signal 54, the second feedback bit signal 56, and the third feedback bit signal 58. Furthermore, note that in this embodiment, the majority gate 94 is clocked, and thus receives the negative side clock signal 20N' and the positive side clock signal 20P' from the clock subpaths 38N' and 38P', respectively. As such, the majority gate 94 shown in FIG. 8 is activated and deactivated by the clock signal 20 instead of by the feedback mode signal 64 (shown in FIG. 4). In this example, the majority gate 94 is configured to deactivate while the clock signal 20 is in the first clock state (which is high in this embodiment), and thus when the slave latch 112 is transparent and the master latch 72 is opaque. The majority gate 94 is configured to activate while the clock signal 20 is second clock state (which is low in this embodiment), and thus when the slave latch 112 is opaque and the master latch 72 is transparent.

When activated, the majority gate 94 drives the first output bit state of the first output bit signal 50 at the storage node 52 in accordance with the majority bit state of the first feedback bit signal 54, the second feedback bit signal 56, and the third feedback bit signal 58. More specifically, the majority gate 94 is configured to generate the feedback output bit signal 62 and set the feedback output bit state in accordance with the majority bit state of the first feedback bit signal 54, the second feedback bit signal 56, and the third feedback bit signal 58 while the clock signal 20 is in the second clock state. However, while the clock signal 20 is in the first clock state and the majority gate 94 is deactivated, the master latch 72 is opaque and the tristate inverter gate 82 in the first master feedback stage 78 holds the intermediary output bit state of the intermediary output bit signal 76. The intermediary output bit state of the intermediary output bit signal 76 was set in accordance with the initial input bit state of the initial input bit signal 74 when the master latch 72 was previously transparent (i.e., while the clock signal 20 was in the second clock state during the previous clock period). As discussed above, the first multiplexer 110 selects the initial input bit state of the initial input bit signal 74.

The intermediary output bit state of the intermediary output bit signal 76 is thus held by the tristate inverter gate 82 in accordance with the initial input bit state of the initial input bit signal 74 while the clock signal 20 is in the first clock state. The tristate inverter gate 82 also holds the first input bit state of the first input bit signal 48 in accordance with the initial input bit state of the initial input bit signal 74 while the clock signal 20 is in the first clock state because the inverter 79 generates the first input bit signal 48 from the intermediary output bit signal 76. With regard to the slave latch 112, the CMOS transmission gate 84 samples the first input bit signal 48 while the clock signal is in the first clock state and thus sets up the first output bit signal 50 at the storage node 52 in accordance with the initial input bit state of the initial input bit signal 74. Since the first feedback bit signal 54 provides feedback for the first output bit signal 50, the first feedback bit state of the first feedback bit signal 54 is set up in accordance with the initial input bit state of the initial input bit signal 74 while the majority gate 94 is deactivated. Thus, when a clock edge that transitions from the first clock state to the second clock state reaches the majority gate 94, the majority gate 94 receives the first feedback bit signal 54 with the first feedback bit state provided as set up in accordance the initial input bit state of the initial input bit signal 74. As a result, the first multiplexer 110 can select how the first feedback bit state is set up. Once the clock signal 20 is in the second clock state and the slave latch 112 is opaque, the majority gate 94 is activated and drives the first output bit state and thus the first feedback bit state in accordance with the majority bit state of the first feedback bit signal 54, the second feedback bit signal 56, and the third feedback bit signal 58. However, the first multiplexer 110 (along with multiplexers in redundant SSEs) selects how this the majority bit state is established during the first clock state when the majority gate 94 is deactivated.

Figure 9:
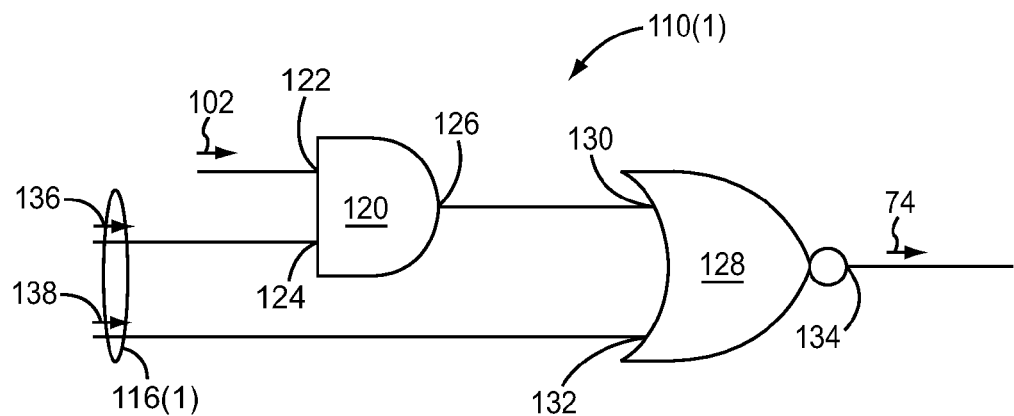
FIG. 9 illustrates a circuit diagram of one embodiment of a multiplexer.

FIG. 9 illustrates a circuit diagram of a multiplexer 110(1). The multiplexer 110(1) is one embodiment of the first multiplexer 110 shown in FIGS. 7 and 8. The multiplexer 110(1) includes an AND gate 120 having an AND gate input terminal 122, an AND gate input terminal 124, and an AND gate output terminal 126. The multiplexer 110(1) further includes a NOR gate 128 that includes a NOR gate input terminal 130, a NOR gate input terminal 132, and a NOR gate output terminal 134. The multiplexer 110(1) is configured to receive a multiplexer output selection input 116(1), which is one embodiment of the first multiplexer output selection input 116. In this embodiment, the multiplexer output selection input 116(1) includes a testing bit signal 136 having a first testing bit state and a testing bit signal 138 having a second testing bit state. The first data input bit signal 102 is received at the AND gate input terminal 122. The testing bit signal 136 is received at the AND gate input terminal 124. The AND gate output terminal 126 of the AND gate 120 is connected to the NOR gate input terminal 130 of the NOR gate 128. The testing bit signal 138 is received at the NOR gate input terminal 132. The NOR gate 128 is configured to generate the initial input bit signal 74, which is transmitted to the master latch 72 (shown in FIGS. 7 and 8).

Consequently, the multiplexer output selection input 116 (1) is bound to a group of selection states, which are determined by the first testing bit state of the testing bit signal 136 and the second testing bit state of the testing bit signal 138. For example, in response to the first testing bit state of the testing bit signal 136 having a logical bit value "1" and the second testing bit state of the testing bit signal 138 having a logical bit value "0," the multiplexer 110(1) is configured to select that the initial input bit state of the initial input bit signal 74 be set in accordance with the data input bit state of the first data input bit signal 102. In this embodiment, the multiplexer output selection input 116(1) may be provided with the first testing bit state of the testing bit signal 136 having a logical bit value "1" and the second testing bit state of the testing bit signal 138 having a logical bit value "0," both during normal operation and while testing the pipeline stage (e.g., the pipeline stage 14A shown in FIG. 1).

Next, in response to the first testing bit state of the testing bit signal 136 having a logical bit value "0" and the second testing bit state of the testing bit signal 138 having a logical bit value "0," the multiplexer 110(1) is configured to select that the initial input bit state of the initial input bit signal 74 be set to the first logical bit value (which in this example is the logical bit value "1"). Finally, in response to the first testing bit state of the testing bit signal 136 having either logical bit value (either the logical bit value "1" or the logical bit value "0") and the second testing bit state of the testing bit signal 138 having a logical bit value "1," the multiplexer 110(1) is configured to select that the initial input bit state of the initial input bit signal 74 be set to the second logical bit value (which in this example is the logical bit value "0").

Figure 10:
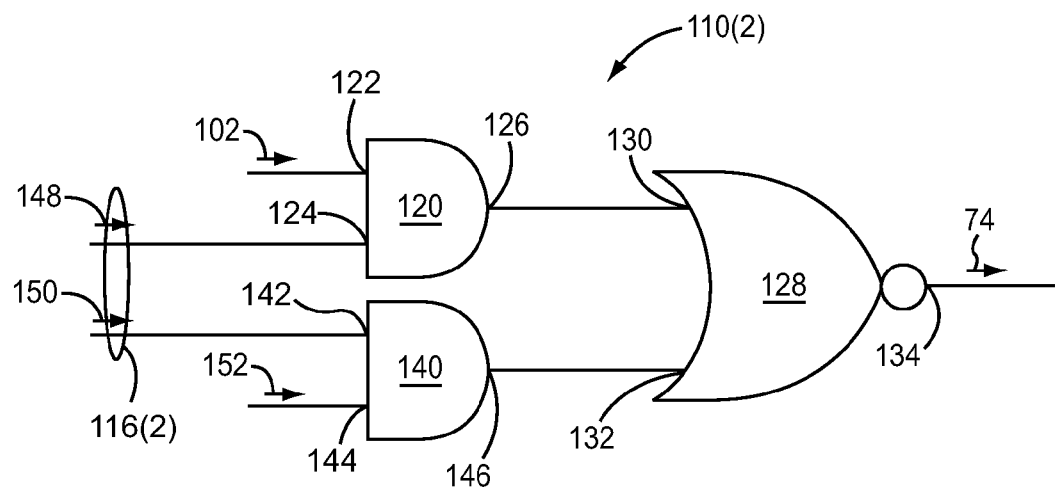
FIG. 10 illustrates a circuit diagram of yet another embodiment of a multiplexer.

FIG. 10 illustrates a circuit diagram of a multiplexer 110 (2). The multiplexer 110(2) is one embodiment of the first multiplexer 110 shown in FIGS. 7 and 8. Like the multiplexer 110(1) shown in FIG. 9, the multiplexer 110(2) includes the AND gate 120 and the NOR gate 128. However, the multiplexer 110(2) further includes an AND gate 140 having an AND gate input terminal 142, an AND gate input terminal 144, and an AND gate output terminal 146. The multiplexer 110(2) is configured to receive a multiplexer output selection input 116(2), which is one embodiment of the first multiplexer output selection input 116. In this embodiment, the multiplexer output selection input 116(2) includes a first scan enable bit signal 148 having a first scan enable bit state and a second scan enable bit signal 150 having a second scan enable bit state. The first data input bit signal 102 is received at the AND gate input terminal 122. The first scan enable bit signal 148 is received at the AND gate input terminal 124. The AND gate output terminal 126 of the AND gate 120 is connected to the NOR gate input terminal 130 of the NOR gate 128. The second scan enable bit signal 150 is received at the AND gate input terminal 142. In this embodiment, a scan mode bit signal 152 having a scan mode bit state is received at the AND gate input terminal 144. The AND gate output terminal 146 of the AND gate 140 is connected to the NOR gate input terminal 132 of the NOR gate 128. The NOR gate 128 is configured to generate the initial input bit signal 74, which is transmitted to the master latch 72 (shown in FIGS. 7 and 8).

Consequently, the multiplexer output selection input 116 (2) is bound to a group of selection states, which are determined by the first scan enable bit state of the first scan enable bit signal 148 and the second scan enable bit state of the second scan enable bit signal 150. For example, in response to the first scan enable bit state of the first scan enable bit signal 148 having a logical bit value "1" and the second scan enable bit state of the second scan enable bit signal 150 having a logical bit value "0," the multiplexer 110(2) is configured to select that the initial input bit state of the initial input bit signal 74 be set in accordance with a first data input bit state of the first data input bit signal 102. In this embodiment, the multiplexer output selection input 116(2) may be provided with the first scan enable bit state of the first scan enable bit signal 148 having the logical bit value "1" and the second scan enable bit state of the second scan enable bit signal 150 having the logical bit value "0" both during normal operation and while testing the pipeline stage (e.g., the pipeline stage 14A shown in FIG. 1).

Next, in response to the first scan enable bit state of the first scan enable bit signal 148 having a logical bit value "0" and the second scan enable bit state of the second scan enable bit signal 150 having a logical bit value "0," the multiplexer 110(2) is configured to select that the initial input bit state of the initial input bit signal 74 be set to the first logical bit value (which in this example is the logical bit value "1"). In response to the first scan enable bit state of the first scan enable bit signal 148 having a logical bit value "1" and the second scan enable bit state of the second scan enable bit signal 150 having a logical bit value "1," the multiplexer 110(2) is configured to select that the initial input bit state of the initial input bit signal 74 be set to the second logical bit value (which in this example is the logical bit value "0"). Finally, in response to the first scan enable bit state of the first scan enable bit signal 148 having a logical bit value "0" and the second scan enable bit state of the second scan enable bit signal 150 having a logical bit value "1," the multiplexer 110(2) is configured to select that the initial input bit state of the initial input bit signal 74 be set in accordance with a scan mode bit state of the scan mode bit signal 152. In this embodiment, the multiplexer output selection input 116(2) may be provided with the first scan enable bit state of the first scan enable bit signal 148 having the logical bit value "0" and the second scan enable bit state of the second scan enable bit signal 150 having the logical bit value "1" while testing the pipeline stage (e.g., the pipeline stage 16A shown in FIG. 1).

Figure 11:
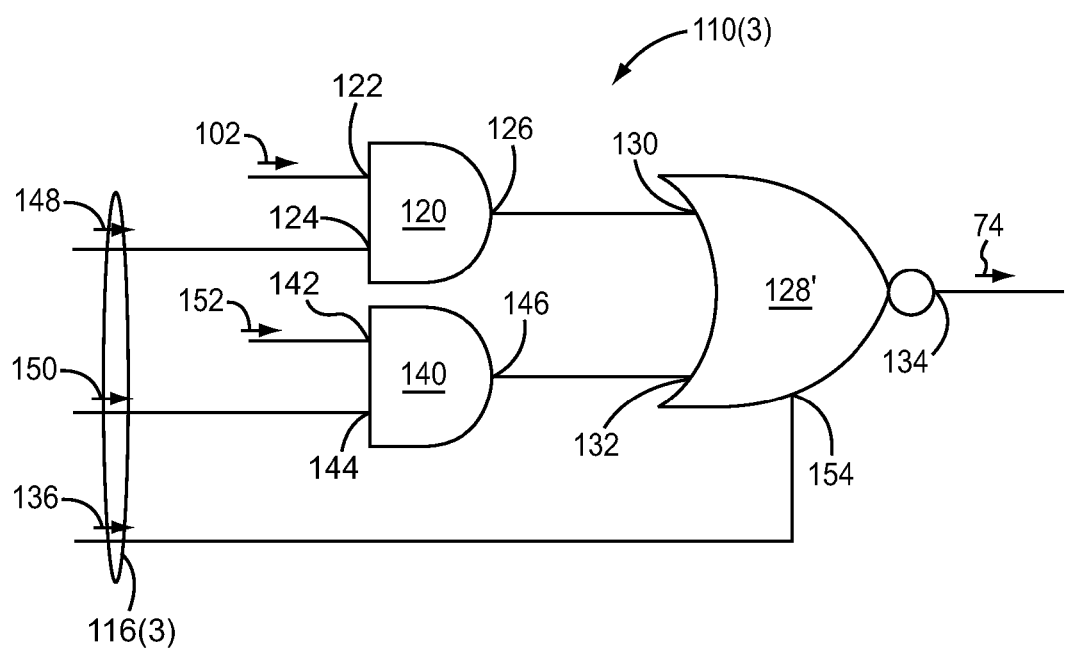
FIG. 11 illustrates a circuit diagram of still another embodiment of a multiplexer.

FIG. 11 illustrates a circuit diagram of a multiplexer 110(3). The multiplexer 110(3) is one embodiment of the first multiplexer 110 shown in FIGS. 7 and 8. Like the multiplexer 110(2) shown in FIG. 10, the multiplexer 110(3) includes the AND gate 120 and the AND gate 140. A NOR gate 128' includes the NOR gate input terminal 130, the NOR gate input terminal 132, and the NOR gate output terminal 134, but further includes a NOR gate enabling terminal 154. The multiplexer 110(3) is configured to receive a multiplexer output selection input 116(3), which is one embodiment of the first multiplexer output selection input 116. In this embodiment, the multiplexer output selection input 116(3) includes the first scan enable bit signal 148, the second scan enable bit signal 150, and the testing bit signal 136. The first data input bit signal 102 is received at the AND gate input terminal 122. The first scan enable bit signal 148 is received at the AND gate input terminal 124. In this embodiment, the scan mode bit signal 152 is received at the AND gate input terminal 142 of the AND gate 140. The second scan enable bit signal 150 is received at the AND gate input terminal 144. The testing bit signal 136 is received at the NOR gate enabling terminal 154 of the NOR gate 128'. The AND gate output terminal 126 of the AND gate 120 is connected to the NOR gate input terminal 130 of the NOR gate 128'. The AND gate output terminal 146 of the AND gate 140 is connected to the NOR gate input terminal 132 of the NOR gate 128'. The NOR gate 128' is configured to generate the initial input bit signal 74, which is transmitted to the master latch 72 (shown in FIGS. 7 and 8).

Consequently, the multiplexer output selection input 116(3) is bound to a group of selection states, which are determined by the first scan enable bit state of the first scan enable bit signal 148, the second scan enable bit state of the second scan enable bit signal 150, and the first testing bit state of the testing bit signal 136. For example, in response to the first scan enable bit state of the first scan enable bit signal 148 having a logical bit value "1," the second scan enable bit state of the second scan enable bit signal 150 having a logical bit value "0," and the first testing bit state of the testing bit signal 136 having a logical bit value of "0," the multiplexer 110(3) is configured to select that the initial input bit state of the initial input bit signal 74 be set in accordance with a first data input bit state of the first data input bit signal 102. In this embodiment, the multiplexer output selection input 116(3) may be provided with the first scan enable bit state of the first scan enable bit signal 148 having a logical bit value "1," the second scan enable bit state of the second scan enable bit signal 150 having a logical bit value "0," and the first testing bit state of the testing bit signal 136 having a logical bit value of "0," both during normal operation and while testing the pipeline stage (e.g., the pipeline stage 14A shown in FIG. 1).

Next, in response to the first scan enable bit state of the first scan enable bit signal 148 having a logical bit value "0," the second scan enable bit state of the second scan enable bit signal 150 having a logical bit value "0," and the first testing bit state of the testing bit signal 136 having a logical bit value of "0," the multiplexer 110(3) is configured to select that the initial input bit state of the initial input bit signal 74 be set to the first logical bit value (which in this example is the logical bit value "1"). In response to the first testing bit state of the testing bit signal 136 having a logical bit value of "1," the multiplexer 110(3) is configured to select that the initial input bit state of the initial input bit signal 74 be set to the second logical bit value (which in this example is the logical bit value "1"), regardless of the logical bit value of the first scan enable bit state and the second scan enable bit state. Finally, in response to the first scan enable bit state of the first scan enable bit signal 148 having a logical bit value "0," the second scan enable bit state of the second scan enable bit signal 150 having a logical bit value "1," and the first testing bit state of the testing bit signal 136 having a logical bit value of "0," the multiplexer 110(3) is configured to select that the initial input bit state of the initial input bit signal 74 be provided in accordance with the scan mode bit state of the scan mode bit signal 152. In this embodiment, the multiplexer output selection input 116(3) may be provided with the first scan enable bit signal 148 having a logical bit value "0," the second scan enable bit state of the second scan enable bit signal 150 having a logical bit value "1," and the first testing bit state of the testing bit signal 136 having a logical bit value of "0" while testing the pipeline stage (e.g., the pipeline stage 16A shown in FIG. 1).

Figure 12:
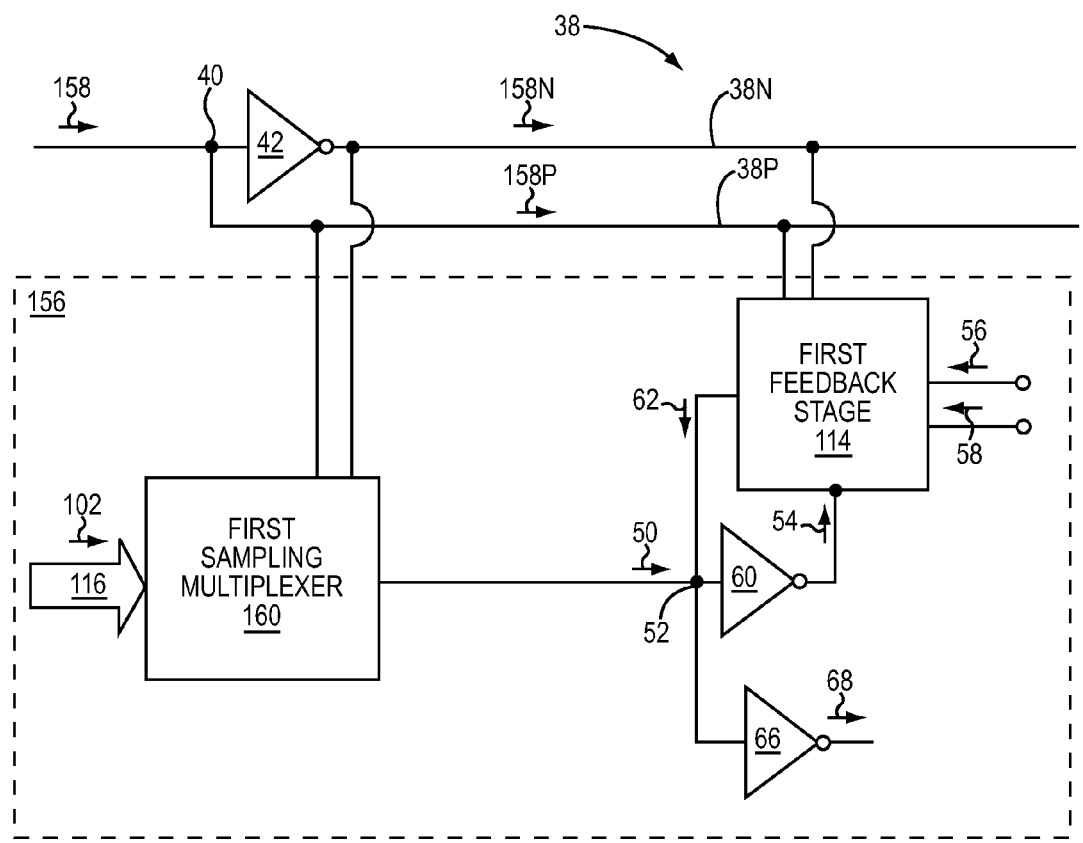
FIG. 12 illustrates a block diagram of an exemplary clocked pulse latch, which is an exemplary SSE that may be utilized within the SSCs shown in FIG. 1.

FIG. 12 illustrates another embodiment of an exemplary SSE, which in this example is a pulsed clock latch 156. The pulsed clock latch 156 shown in FIG. 12 is synchronizable in accordance with an asymmetric clock signal 158, which oscillates between a first clock state and a second clock state. The total amount of time it takes the asymmetric clock signal 158 to oscillate once between the first clock state and the second clock state is referred to as a clock period. Again, for the purposes of explanation and clarity, the first clock state is assumed to be a clock state in which the pulsed clock latch 156 is transparent, while the second clock state is assumed to be a clock state in which the pulsed clock latch 156 is opaque. However, with regard to the clock duty cycle of the asymmetric clock signal 158, the asymmetric clock signal 158 is in the second clock state for a greater amount of time than an amount of time that the asymmetric clock signal 158 is in the first clock state.

Like the clock signal 20 for the latch 36 shown in FIG. 2, the asymmetric clock signal 158 is provided to the pulsed clock latch 156 along the clock signal path 38, which is split at the node 40 into the two clock subpaths 38N and 38P. The inverter 42 is provided within the clock subpath 38N, which is the negative side clock subpath. The inverter 42 is operable to invert the asymmetric clock signal 158 within the clock subpath 38N and generate an asymmetric negative side clock signal 158N. No inverter has been provided in the clock subpath 38P, which is a positive side clock subpath. Accordingly, an asymmetric positive side clock signal 158P is provided in the clock subpath 38P, which is the positive side clock subpath. As explained in further detail below, a topology of the pulsed clock latch 156 allows for the pulsed clock latch 156 to set up quickly. Since the amount of time that the asymmetric clock signal 158 is in the second clock state is longer than the amount of time that the asymmetric clock signal 158 is in the first clock state during the clock period, the pulsed clock latch 156 is opaque for a majority of the clock period. In this manner, the pulsed clock latch 156 allows for temporal resources to be focused on having the pulsed clock latch 156 meet hold time requirements. In this manner, the asymmetric clock signal 158 deraces the pulsed clock latch 156. As a result, the SSE shown in FIG. 12 does not include a master latch.

With regard to the topology of the pulsed clock latch 156, the pulsed clock latch 156 includes a first sampling multiplexer 160. The first sampling multiplexer 160 has both sampling functionality and the selection functionality and is thus both a sampling stage and a multiplexer. Like the first multiplexer 110 shown in FIG. 7, the first sampling multiplexer 160 is configured to receive the first data input bit signal 102 (i.e., the data line bit signal) and the first multiplexer output selection input 116. However, in this embodiment, the first sampling multiplexer 160 of the pulsed clock latch 156 is configured to generate the first output bit signal 50, rather than the initial input bit signal 74 (shown in FIG. 7), when the first sampling multiplexer 160 is activated. More specifically, the first sampling multiplexer 160 is configured to generate the first output bit signal 50 by being configured to select between setting the first output bit state to a first logical bit value (e.g., a logical bit value of "1"), setting the first output bit state to a second logical bit value (e.g., a logical bit value "0") opposite the first logical bit value, and setting the first output bit state in accordance with the first data input bit state of the first data input bit signal 102 in response to the first multiplexer output selection input 116.

In one embodiment, the first multiplexer output selection input 116 is bound to the group of selection states. As explained above, the group of selection states includes at least the first selection state, the second selection state, and the third selection state. Each of the selection states in the group of selection states indicates a different selection to be made by the first sampling multiplexer 160. For example, the first sampling multiplexer 160 is configured to select that the first output bit state be set to the first data input bit state of the first data input bit signal 102 in response to the first multiplexer output selection input 116 being provided in the first selection state. More specifically, while the asymmetric clock signal 158 is in the first clock state, the first sampling multiplexer 160 is configured to sample the first data input bit state of the first data input bit signal 102 and generate the first output bit signal 50 having the first output bit state set in accordance with the first data input bit state. The first multiplexer output selection input 116 may be provided in the first selection state during normal operation. However, as explained in further detail below, in some embodiments, the first multiplexer output selection input 116 may also be provided in the first selection state while testing a pipeline stage (e.g., the pipeline stage 14A shown in FIG. 1).

Next, the first sampling multiplexer 160 is configured to select that the first output bit state be set to the first logical bit value in response to the first multiplexer output selection input 116 being provided in the second selection state. The first sampling multiplexer 160 is unresponsive to the first data input bit signal 102 and any other data bit signal in response to the first multiplexer output selection input 116 being provided in the second selection state. Instead, the first sampling multiplexer 160 is configured to force the first output bit state to be the first logical bit value (e.g., logical bit value "1") when the first multiplexer output selection input 116 is provided in the second selection state. As explained in further detail below, the first multiplexer output selection input 116 may be provided in the second selection state while testing another redundant pipeline stage (e.g., the pipeline stage 14B or the pipeline stage 14C shown in FIG. 1).

Finally, the first sampling multiplexer 160 is configured to select that first output bit state be set to the second logical bit value opposite the first logical bit value in response to the first multiplexer output selection input 116 being provided in the third selection state. The first sampling multiplexer 160 is also unresponsive to the first data input bit signal 102 and any other data bit signal in response to the first multiplexer output selection input 116 being provided in the third selection state. Instead, the first sampling multiplexer 160 is configured to force the first output bit state to be the second logical bit value (e.g., logical bit value "0") when the first multiplexer output selection input is provided in the third selection state. As explained in further detail below, the first multiplexer output selection input 116 may be provided in the third selection state while testing another redundant pipeline stage (e.g., the pipeline stage 14B or the pipeline stage 14C shown in FIG. 1).

Like the slave latch 112 shown in FIG. 7, the pulsed clock latch 156 shown in FIG. 12 includes the storage node 52, the first feedback stage 114, the inverter 60, and the inverter 66. However in this embodiment, the first feedback stage 114 is operable to receive the asymmetric clock signal 158. Thus, while the asymmetric clock signal 158 is in the first clock state and the pulsed clock latch 156 is transparent, the first feedback stage 114 is deactivated and the first sampling multiplexer 160 sets up the first output bit state of the first output bit signal 50 at the storage node 52 in the manner selected by the first sampling multiplexer 160 in response to the first multiplexer output selection input 116. The first feedback bit signal 54 provides feedback for the first output bit signal 50 since the inverter 60 generates the first feedback bit signal 54 from the first output bit signal 50. Thus, the first feedback stage 114 shown in FIG. 12 is operably associated with the first sampling multiplexer 160 such that the first feedback bit state of the first feedback bit signal 54 is set up in accordance with the first output bit state of the first output bit signal 50 while the asymmetric clock signal 158 is in the first clock state. While the asymmetric clock signal 158 is in the second clock state, the pulsed clock latch 156 is opaque. Accordingly, the first feedback stage 114 is activated and is configured to hold (i.e., by generating the feedback output bit signal 62) the first output bit state of the first output bit signal 50 at the storage node 52 in accordance with the majority bit state of the first feedback bit signal 54, the second feedback bit signal 56, and the third feedback bit signal 58 in the same manner described above with regard to FIG. 7. Also, as described above, the inverter 66 generates the final output bit signal 68 from the first output bit signal 50.

Figure 13:
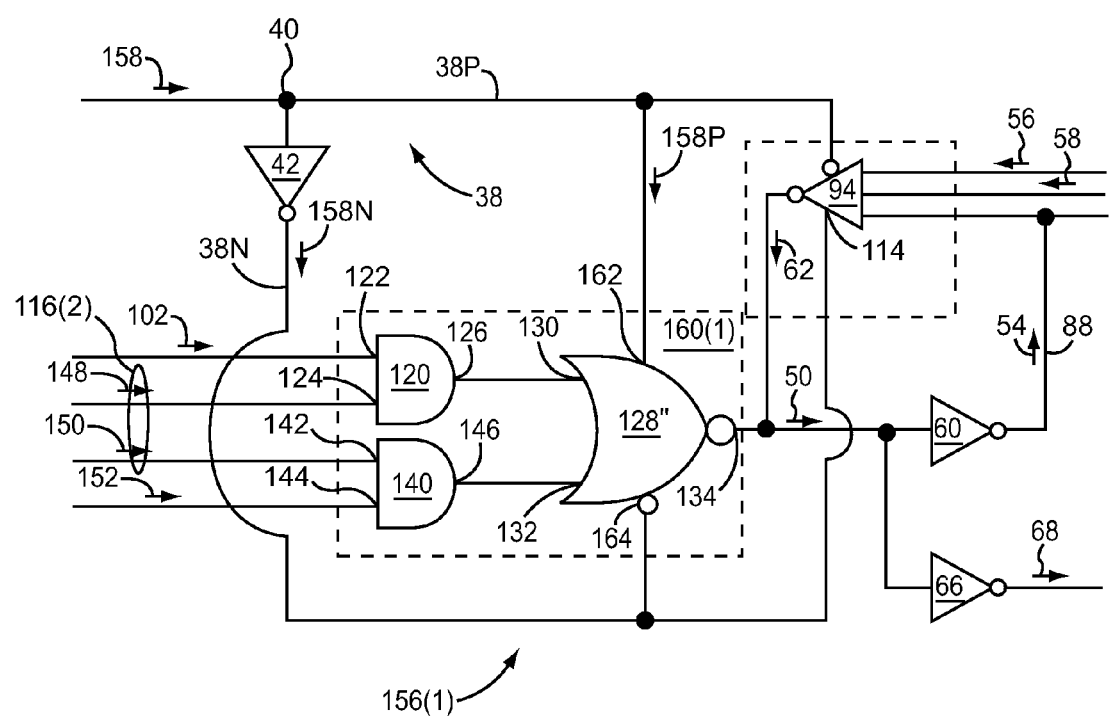
FIG. 13 illustrates a circuit diagram of a clocked pulse latch, which is one embodiment of the clocked pulse latch shown in FIG. 12.

FIG. 13 illustrates a circuit diagram of an exemplary pulsed clock latch 156(1). The pulsed clock latch 156(1) is one embodiment of the pulsed clock latch 156 shown in FIG. 12. In this embodiment, the pulsed clock latch 156(1) is configured to be transparent during the first clock state of the asymmetric clock signal 158, which in this embodiment is high, and is configured to be opaque during the second clock state of the asymmetric clock signal 158, which in this embodiment is low. The pulsed clock latch 156(1) includes a first sampling multiplexer 160(1). The first sampling multiplexer 160(1) is one embodiment of the first sampling multiplexer 160 shown in FIG. 12.

The first sampling multiplexer 160(1) shown in FIG. 13 is similar to the multiplexer 110(2) shown in FIG. 10. Thus, the first sampling multiplexer 160(1) includes the AND gate 120 and the AND gate 140. A NOR gate 128" includes the NOR gate input terminal 130, the NOR gate input terminal 132, and the NOR gate output terminal 134, but further includes a NOR gate enabling terminal 162 and a NOR gate enabling terminal 164. The NOR gate enabling terminal 162 is configured to receive the asymmetric positive side clock signal 158P and the NOR gate enabling terminal 164 is configured to receive the asymmetric negative side clock signal 158N. In this manner, the first sampling multiplexer 160(1) is activated while the asymmetric clock signal 158 is in the first clock state (e.g., high) and is deactivated while the asymmetric clock signal 158 is in the second clock state (e.g., low).

The first sampling multiplexer 160(1) is configured to receive the multiplexer output selection input 116(2), which is the same embodiment of the first multiplexer output selection input 116 (shown in FIG. 12) received by the multiplexer 110(2) shown in FIG. 10. In this embodiment, the multiplexer output selection input 116(2) includes the first scan enable bit signal 148, the second scan enable bit signal 150, and the testing bit signal 136. The first data input bit signal 102 is received at the AND gate input terminal 122. The first scan enable bit signal 148 is received at the AND gate input terminal 124. The second scan enable bit signal 150 is received at the AND gate input terminal 142. In this embodiment, the scan mode bit signal 152 is received at the AND gate input terminal 144 of the AND gate 140. The AND gate output terminal 126 of the AND gate 120 is connected to the NOR gate input terminal 130 of the NOR gate 128". The AND gate output terminal 146 of the AND gate 140 is connected to the NOR gate input terminal 132 of the NOR gate 128". The NOR gate 128" is configured to generate the first output bit signal 50 from the NOR gate output terminal 134 while the asymmetric clock signal 158 is in the first clock state.

In response to the first scan enable bit state of the first scan enable bit signal 148 having a logical bit value "1" and the second scan enable bit state of the second scan enable bit signal 150 having a logical bit value "0," the first sampling multiplexer 160(1) is configured to select that the first output bit state of the first output bit signal 50 be set in accordance with a first data input bit state of a first data input bit signal 102. In this embodiment, the multiplexer output selection input 116(2) may be provided with the first scan enable bit state of the first scan enable bit signal 148 having the logical bit value "1" and the second scan enable bit state of the second scan enable bit signal 150 having the logical bit value "0" both during normal operation and while testing the pipeline stage (e.g., the pipeline stage 14A shown in FIG. 1).

Next, in response to the first scan enable bit state of the first scan enable bit signal 148 having a logical bit value "0" and the second scan enable bit state of the second scan enable bit signal 150 having a logical bit value "0," the first sampling multiplexer 160(1) is configured to select that the first output bit state of the first output bit signal 50 be set to the first logical bit value (which in this example is the logical bit value "1"). In response to the first scan enable bit state of the first scan enable bit signal 148 having a logical bit value "1" and the second scan enable bit state of the second scan enable bit signal 150 having a logical bit value "1," the first sampling multiplexer 160(1) is configured to select that the first output bit state of the first output bit signal 50 be set to the second logical bit value (which in this example is the logical bit value "0"). Finally, in response to the first scan enable bit state of the first scan enable bit signal 148 having a logical bit value "0" and the second scan enable bit state of the second scan enable bit signal 150 having a logical bit value "1," the first sampling multiplexer 160(1) is configured to select that the first output bit state of the first output bit signal 50 be set in accordance with the scan mode bit state of the scan mode bit signal 152. In this embodiment, the multiplexer output selection input 116(2) may be provided with the first scan enable bit state of the first scan enable bit signal 148 having the logical bit value "0" and the second scan enable bit state of the second scan enable bit signal 150 having the logical bit value "1" while testing the pipeline stage (e.g., the pipeline stage 16A shown in FIG. 1).

The first feedback stage 114 is the same as the one described above with respect to FIG. 8 and thus includes the majority gate 94. However, in this embodiment, the majority gate 94 is clocked by the asymmetric clock signal 158 and thus receives the asymmetric positive side clock signal 158P and the asymmetric negative side clock signal 158N from the clock subpaths 38N and 38P, respectively. As such, the majority gate 94 shown in FIG. 8 is activated and deactivated by the asymmetric clock signal 158. In this example, the majority gate 94 is configured to deactivate while the asymmetric clock signal 158 is in the first clock state (which is high in this embodiment) and thus when the pulsed clock latch 156(1) is transparent. The majority gate 94 is configured to activate while the asymmetric clock signal 158 is in the second clock state (which is low in this embodiment) and thus when the pulsed clock latch 156(1) is opaque. The majority gate 94 shown in FIG. 13 is thus activated for a majority of a clock period of the asymmetric clock signal 158.

FIG. 14 illustrates one embodiment of a clock generation circuit 166. The clock generation circuit 166 is configured to generate the asymmetric clock signal 158 from the clock signal 20. The clock generation circuit includes an AND gate 168 having an AND gate input terminal 170, an AND gate input terminal 172, and an AND gate output terminal 174. The clock generation circuit 166 also includes a delay circuit 176, which in this embodiment includes an inverter 178, an inverter 180, and an inverter 182 coupled in series. The AND gate 168 is configured to receive the clock signal 20 at the AND gate input terminal 170 while the delay circuit 176 is configured to receive the clock signal 20 at the inverter 178.

The delay circuit 176 is configured to have a propagation delay Δd and is thus configured to generate a delayed clock signal 184. The delayed clock signal 184 is received by the AND gate 168 at the AND gate input terminal 172. Note that the inverter 178, the inverter 180, and the inverter 182 in the delay circuit 176 provide an odd number of inversions. Consequently, the delayed clock signal 184 is inverted and delayed with respect to the clock signal 20 by the propagation delay Δd. The propagation delay Δd is significantly shorter than a time duration t of a clock period of the clock signal 20. Thus, although the delayed clock signal 184 also has a clock period of the time duration t, the clock signal 20 and the delayed clock signal 184 overlap in the first clock state (which in this embodiment is high) for the propagation delay Δd. Consequently, the AND gate 168 generates the asymmetric clock signal 158 from the AND gate output terminal 174 in the first clock state during a clock period having a time duration equal to the propagation delay Δd. The clock signal path 38 (shown in FIGS. 7 and 8) may be coupled to the AND gate output terminal 174 so as to receive the asymmetric clock signal 158.

FIG. 15 illustrates one embodiment of the clock signal 20 and a clock period C of the clock signal 20. The clock period C has the time duration t. In this embodiment, the clock signal 20 is configured to oscillate between the first clock state (which in this embodiment is high) and the second clock state (which in this embodiment is low) with approximately a fifty percent duty cycle. Thus, the clock signal 20 is in the first clock state for t/2 and is in the second clock state for t/2 during the clock period C.

FIG. 15 also illustrates one embodiment of the asymmetric clock signal 158 generated by the clock generation circuit 166 and a clock period C' of the asymmetric clock signal 158. The clock period C' is also configured to oscillate between the first clock state (which in this embodiment is high) and the second clock state (which in this embodiment is low) and the clock period C' also has the time duration t. However, the clock signal 20 and the delayed clock signal 184 (shown in FIG. 14) overlap in the first clock state (which in this embodiment is high) for the propagation delay Δd, and thus the asymmetric clock signal 158 is provided in the first clock state for the propagation delay Δd. The asymmetric clock signal 158 is in the second clock state for a time duration t−Δd during the clock period C'. Thus, a duty cycle of the asymmetric clock signal 158 is provided such that the asymmetric clock signal 158 is in the second clock state for a time duration (in this embodiment t−Δd) that is significantly longer than a time duration (in this embodiment the propagation delay Δd) that the asymmetric clock signal 158 is in the first clock state during the clock period C'.

Figure 16:
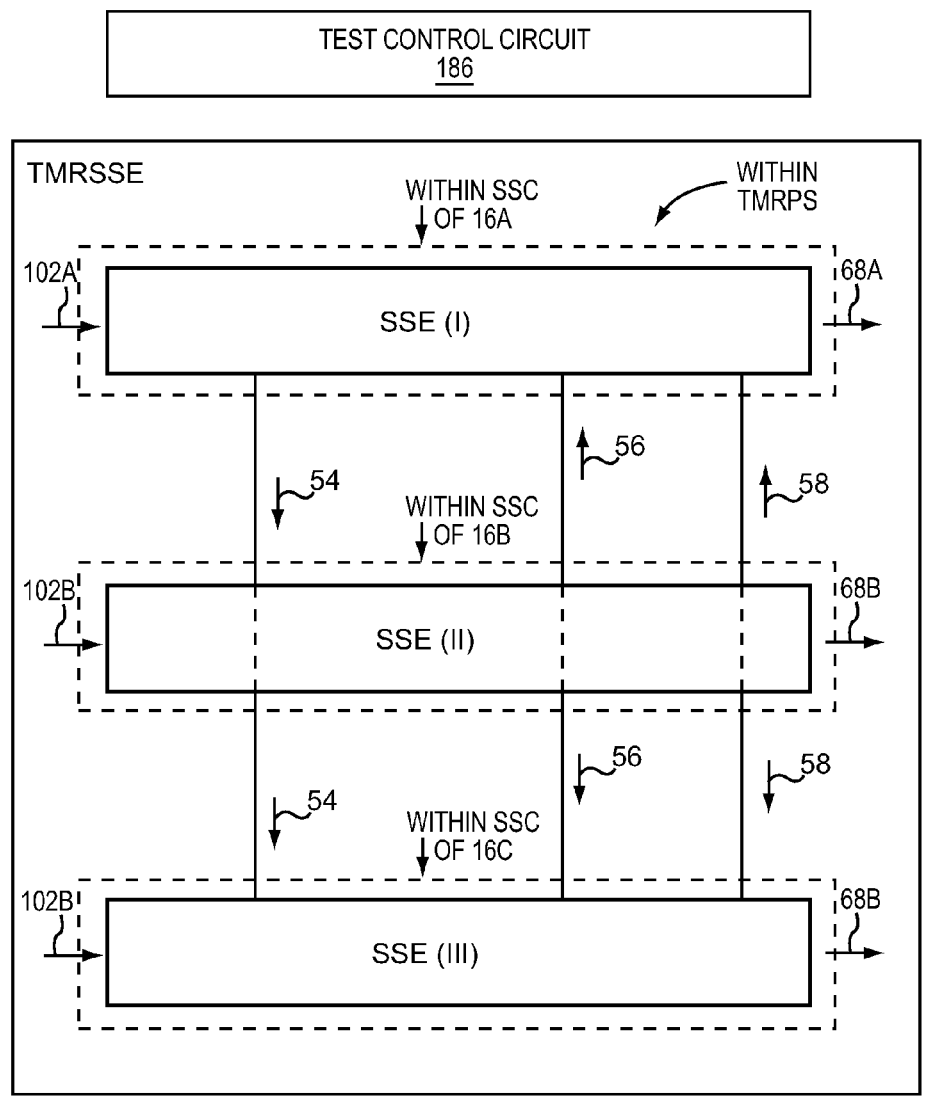
FIG. 16 illustrates a block diagram of an exemplary triple-mode redundant sequential state element (TMRSSE).

FIG. 16 illustrates a block diagram of a TMRSSE. The TMRSSE has an SSE(I), an SSE(II), and an SSE(III), which are redundant and voter configured. Accordingly, each SSE may be arranged as any of the SSEs. Each SSE may also have any one of the arrangements described above with respect to FIGS. 2-13. However, each SSE would generate a different one of the feedback input bit signals 54, 56, 58 and provide it to the other SSEs. In this embodiment, the SSE(I) generates the first feedback bit signal 54 and provides it to the SSE(II) and the SSE(III). The SSE(II) generates the second feedback bit signal 56 and provides it to the SSE(I) and the SSE(III). The SSE(III) generates the third feedback bit signal 58 and provides it to the SSE(I) and the SSE(III). To illustrate how the TMRSSE in FIG. 16 could be provided in the TMRSM 10 shown in FIG. 1, the TMRSSE is assumed to be within the TMRPS PS2. More specifically, the SSE(I) of the TMRSSE is within the SSC of the pipeline stage 16A. The SSE(II) of the TMRSSE is within the SSC of the pipeline stage 16B. The SSE(III) of the TMRSSE is within the SSC of the pipeline stage 16C. A test control circuit 186 is utilized to test the CLCs of the TMRPS PS1 with the TMRSSE shown in FIG. 16, which is in the TMRPS PS2.

Figure 17A:
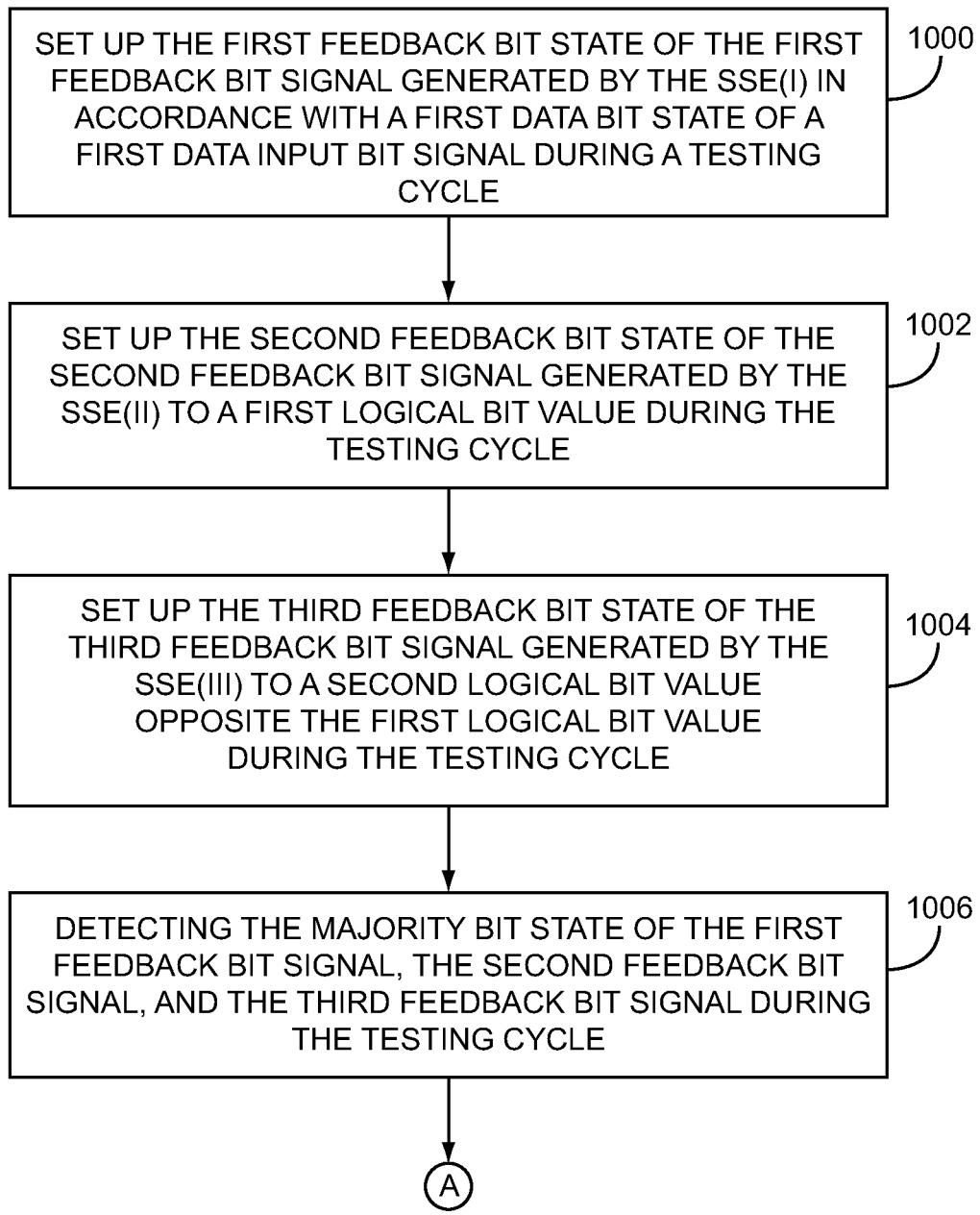
FIGS. 17A-17C illustrate exemplary procedures that may be utilized to test a triple-mode redundant pipeline stage (TMRPS) with the TMRSSE shown in FIG. 16.

Referring now to FIG. 16 and FIGS. 17A-17C, FIG. 17s 17A-17C illustrate one embodiment of a method of testing the CLCs of a TMRPS with the TMRSSE using the test control circuit 186 shown in FIG. 16. FIG. 17A illustrates procedures that test the CLC in the pipeline stage 14A shown in FIG. 1. More specifically, the test control circuit 186 may utilize the TMRSSE in the TMRPS PS2 described above with regard to FIG. 16 to test the CLCs of the TMRPS PS1 shown in FIG. 1. To test the CLC in the pipeline stage 14A of the TMRPS PS1, the test control circuit 186 sets up the first feedback bit state of the first feedback bit signal 54 generated by the SSE(I) in accordance with the first data bit state of the first data input bit signal 102A (which is the first data input bit signal 102 shown in FIGS. 5-13, but is now referred as element 102A to simplify the following explanation) during a testing cycle (procedure 1000). The first data input bit signal 102A is one of the data line bit signals in the data input 26A shown in FIG. 1. The test control circuit 186 sets up the second feedback bit state of the second feedback bit signal 56 generated by the SSE(II) to a first logical bit value (e.g., a logical bit value "1") during the testing cycle (procedure 1002). The test control circuit 186 sets up the third feedback bit state of the third feedback bit signal 58 generated by the SSE(III) to a second logical bit value (e.g., a logical bit value "0") opposite the first logical bit value during the testing cycle (procedure 1004). In this manner, the majority bit state of the first feedback bit signal 54, the second feedback bit signal 56, and the third feedback bit signal 58 is determined by the first data bit state of the first data input bit signal 102A. The test control circuit 186 then detects the majority bit state of the first feedback bit signal 54, the second feedback bit signal 56, and the third feedback bit signal 58 during the testing cycle (procedure 1006).

This can be done directly or indirectly. For example, to directly detect the majority bit state of the first feedback bit signal 54, the second feedback bit signal 56, and the third feedback bit signal 58, the first feedback bit state, the second feedback bit state, and/or the third feedback bit state may be directly detected by the test control circuit 186. However, to directly detect the majority bit state of the first feedback bit signal 54, the second feedback bit signal 56, and the third feedback bit signal 58, the test control circuit 186 may simply detect another bit signal having a bit state determined by the majority bit state of the first feedback bit signal 54, the second feedback bit signal 56, and the third feedback bit signal 58. For example, a final output bit state of the final output bit signal 68A (which is the final output bit signal 68 shown in FIGS. 2-13, but is now referred as element 68A to simplify the following explanation) generated by the SSE(I), a final output bit state of a final output bit signal 68B generated by the SSE(II), and a final output bit state of a final output bit signal 68C generated by the SSE(III) are determined by the majority bit state of the first feedback bit signal 54, the second feedback bit signal 56, and the third feedback bit signal 58. Thus, the test control circuit 186 can indirectly detect the majority bit state of the first feedback bit signal 54, the second feedback bit signal 56, and the third feedback bit signal 58 by detecting the final output bit state of the final output bit signal 68A, the final output bit state of the final output bit signal 68B, and/or the final output bit state of the final output bit signal 68C. If the majority bit state of the first feedback bit signal 54, the second feedback bit signal 56, and the third feedback bit signal 58 is incorrect, then there has been a soft error or a hard error in the CLC of the pipeline stage 14A.

Note that even if the SSE(I), SSE(II), and SSE(III) each have a topology described by one of the embodiments in FIGS. 2-6, the procedures in FIG. 17A can be used for testing when the SSE(I), SSE(II), and SSE(III) are in the second feedback mode. Thus, by testing in the manner described herein, the first feedback mode may, but does not have to, be used for testing.

Figure 17B:
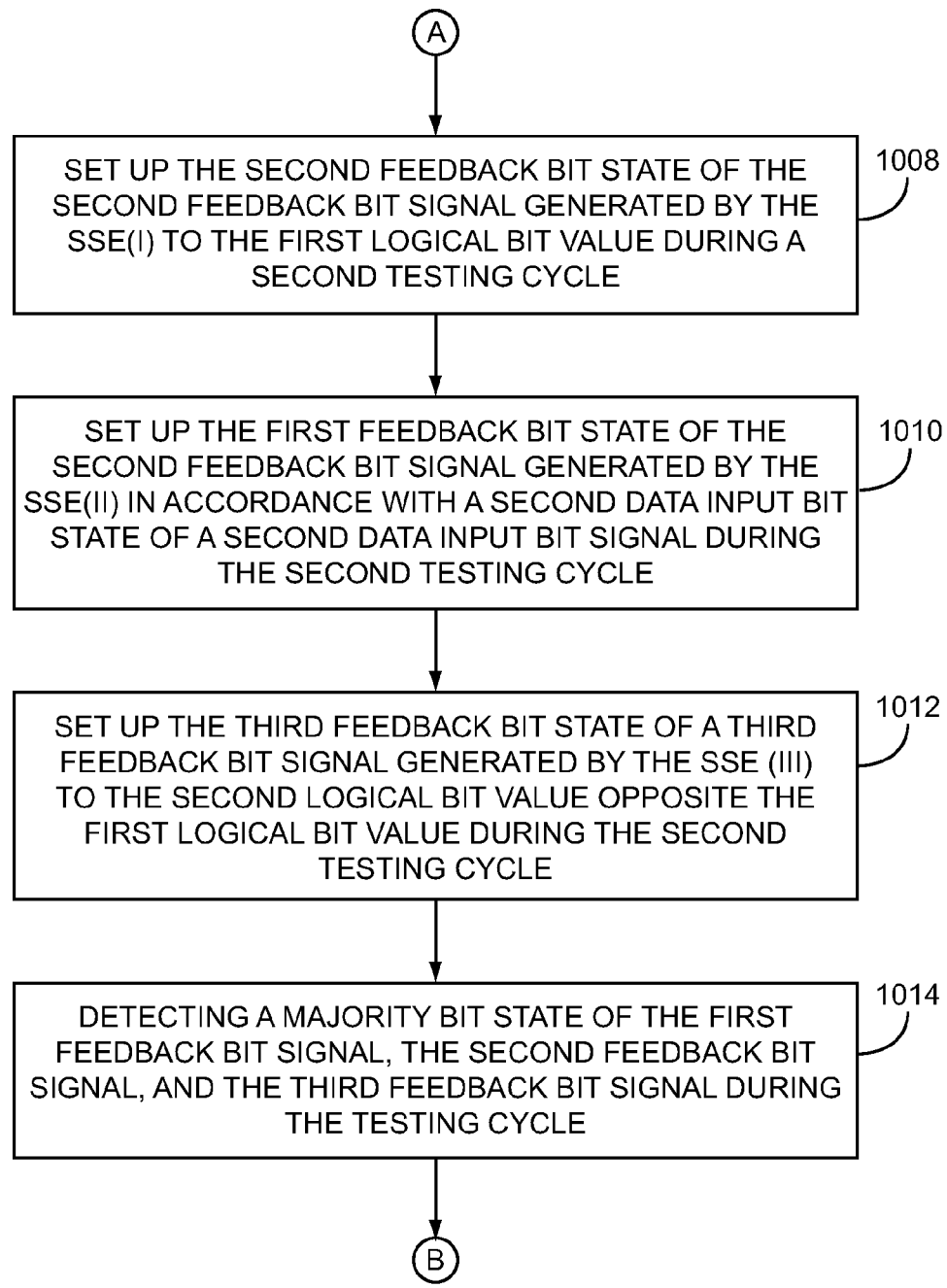

FIG. 17B illustrates procedures that test the CLC in the pipeline stage 14B shown in FIG. 1. More specifically, the test control circuit 186 may utilize the TMRSSE in the TMRPS PS2 described above with regard to FIG. 16 to test the CLCs of the TMRPS PS1 shown in FIG. 1. To test the CLC in the pipeline stage 14B of the TMRPS PS1, the test control circuit 186 sets up the first feedback bit state of the first feedback bit signal 54 generated by the SSE(I) in accordance with the first logical bit value (e.g., the logical bit value "1" of the first data input bit signal 102A during a second testing cycle (procedure 1008). The test control circuit 186 also sets up the second feedback bit state of the second feedback bit signal 56 generated by the SSE(II) in accordance with a second data input bit state of a second data input bit signal 102B during the second testing cycle (procedure 1010). In accordance with the testing example described herein, the second data input bit signal 102B is one of the data line bit signals in the data input 26B generated by the CLC in the pipeline stage 14B shown in FIG. 1. In addition, the test control circuit 186 sets up the third feedback bit state of the third feedback bit signal 58 generated by the SSE(III) to the second logical bit value (e.g., the logical bit value "0") opposite the first logical bit value during the second testing cycle (procedure 1012). In this manner, the majority bit state of the first feedback bit signal 54, the second feedback bit signal 56, and the third feedback bit signal 58 is determined by the second data bit state of the second data input bit signal 102B. The test control circuit 186 then detects the majority bit state of the first feedback bit signal 54, the second feedback bit signal 56, and the third feedback bit signal 58 during the second testing cycle (procedure 1014). This can be done directly or indirectly, as described above.

Figure 17C:
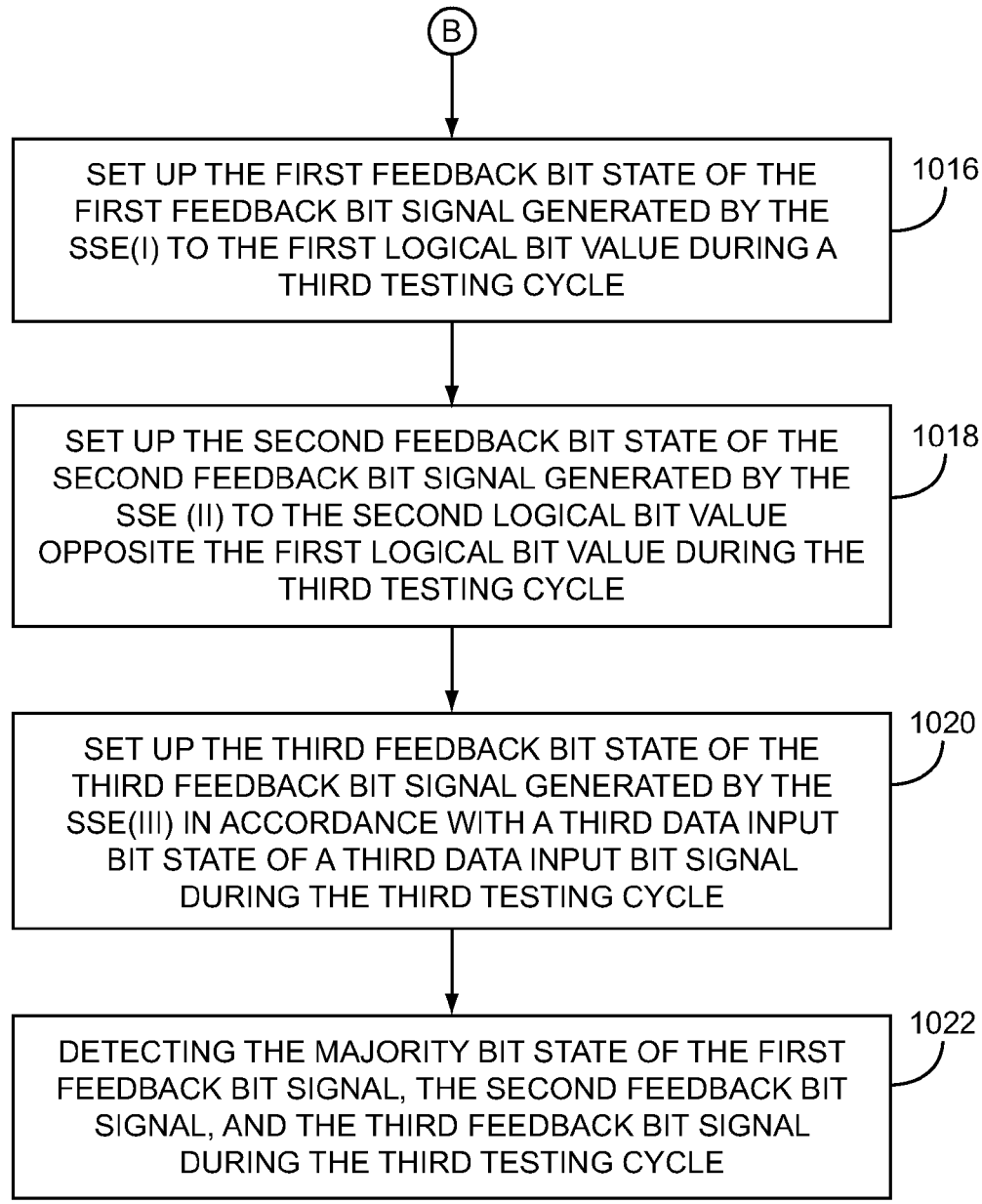

FIG. 17C illustrates procedures that test the CLC in the pipeline stage 14C shown in FIG. 1. More specifically, the test control circuit 186 may utilize the TMRSSE in the TMRPS PS2 described above with regard to FIG. 16 to test the CLCs of the TMRPS PS1 shown in FIG. 1. To test the CLC in the pipeline stage 14C of the TMRPS PS1, the test control circuit 186 sets up the first feedback bit state of the first feedback bit signal 54 generated by the SSE(I) in accordance with the first logical bit value (e.g., the logical bit value "1") of the first data input bit signal 102A during the third testing cycle (procedure 1016). The test control circuit 186 also sets up the second feedback bit state of the second feedback bit signal 56 generated by the SSE(II) to the second logical bit value (e.g., the logical bit value "0") during the third testing cycle (procedure 1018). In addition, the test control circuit 186 sets up the third feedback bit state of the third feedback bit signal 58 generated by the SSE(III) in accordance with a third data input bit state of a third data input bit signal during the third testing cycle (procedure 1020). In accordance with the testing example described herein, the third data input bit signal 102C is one of the data line bit signals in the data input 26C generated by the CLC in the pipeline stage 14C shown in FIG. 1. Accordingly, the majority bit state of the first feedback bit signal 54, the second feedback bit signal 56, and the third feedback bit signal 58 is determined by the third data input bit state of the third data input bit signal 102C. The test control circuit 186 then detects the majority bit state of the first feedback bit signal 54, the second feedback bit signal 56, and the third feedback bit signal 58 during the third testing cycle (procedure 1022). This can be done directly or indirectly as described above.

Figure 18:
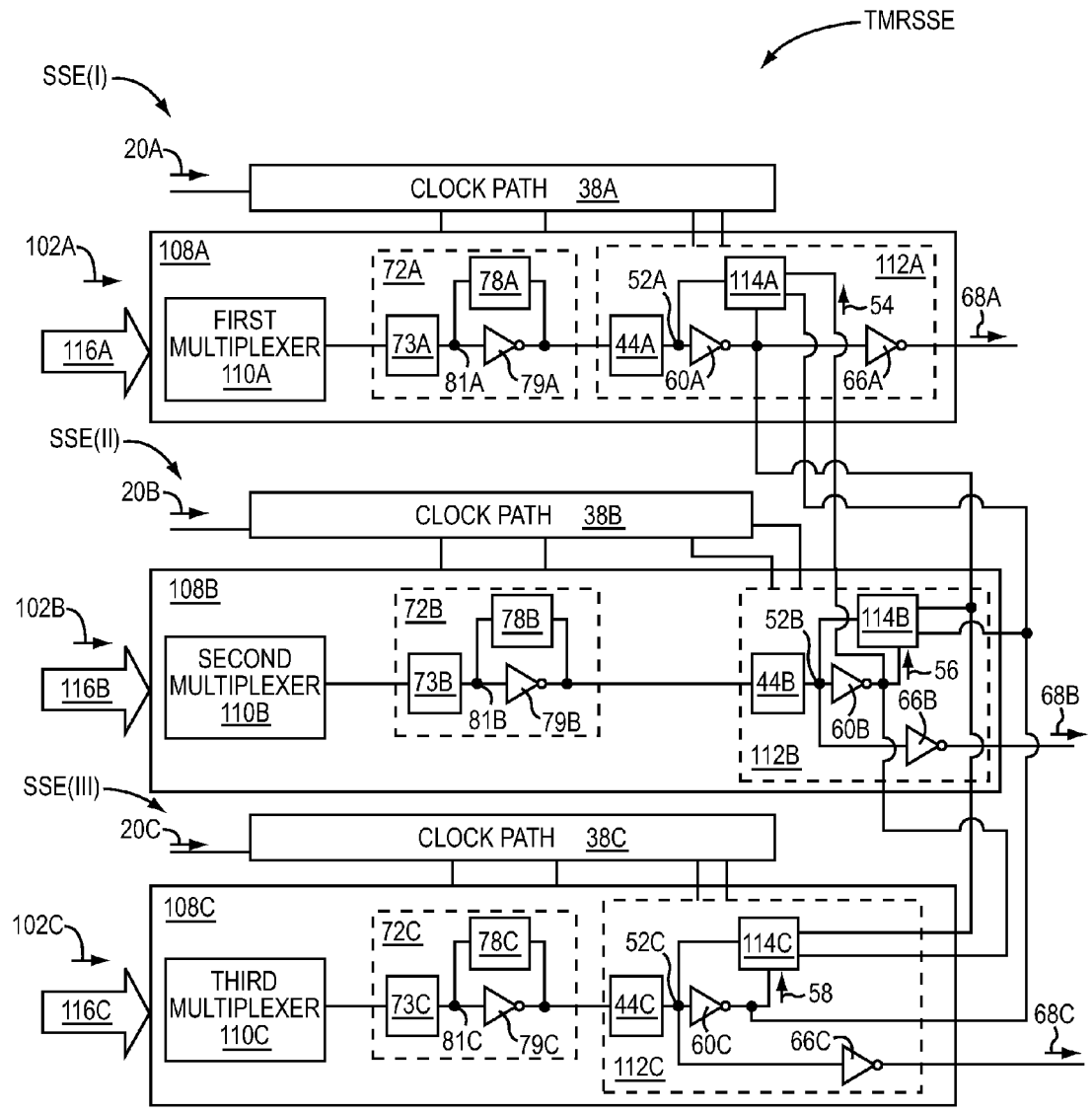
FIG. 18 illustrates one embodiment of the TMRSSE shown in FIG. 16 wherein each of the SSEs in the TMRSSE is provided in accordance with the SSE shown in FIG. 7.

FIG. 18 illustrates one embodiment of the TMRSSE shown in FIG. 16, which includes one embodiment of the SSE(I), the SSE(II), and the SSE(III). In this embodiment, the SSE(I) is the flip-flop 108 shown in FIG. 7, which in this embodiment is referred to as a flip-flop 108A for the sake of clarity. Thus, the first multiplexer 110 is referred to as a first multiplexer 110A, the master latch 72 is referred to as a master latch 72A, the first master sampling stage 73 is referred to as a first master sampling stage 73A, the first master feedback stage 78 is referred to as a first master feedback stage 78A, the inverter 79 is referred to as an inverter 79A, the storage node 81 is referred to as a storage node 81A, the slave latch 112 is referred to as a slave latch 112A, the first sampling stage 44 is referred to as a first slave sampling stage 44A, the storage node 52 is referred to as a storage node 52A, the first feedback stage 114 is referred to as a first slave feedback stage 114A, the inverter 60 is referred to as an inverter 60A, and the inverter 66 is referred to as an inverter 66A. The first multiplexer 110A is configured to receive the first data input bit signal 102A and the first multiplexer test mode input 116, which is referred to as a first multiplexer test mode input 116A. The clock signal path 38 is referred to as a clock signal path 38A and receives the clock signal 20 (referred to as a clock signal 20A in this embodiment).

The SSE(II) is a flip-flop 108B that is identical to the flip-flop 108A, except that the flip-flop 108B generates the second feedback bit signal 56, receives the first feedback bit signal 54 from the SSE(I), receives the third feedback bit signal 58 from the SSE(III), receives the second data input bit signal 102B, and receives a second multiplexer test mode input 116B. More specifically, the flip-flop 108B includes a second multiplexer 110B that is identical to the first multiplexer 110A, except the second multiplexer 110B is configured to receive the second data input bit signal 102B and the second multiplexer test mode input 116B (which is directly analogous to, but independent of, the first multiplexer test mode input 116A) in order to control the flip-flop 108B independently. Furthermore, the flip-flop 108B includes a second master latch 72B that is identical to the master latch 72A, a second master sampling stage 73B that is identical to the first master sampling stage 73A, a second master feedback stage 78B that is identical to first master feedback stage 78A, an inverter 79B that is identical to the inverter 79A, a storage node 81B that is identical to the storage node 81A, a second slave latch 112B that is identical to the slave latch 112A, a second slave sampling stage 44B that is identical to the first slave sampling stage 44A, a storage node 52B that is identical to the storage node 52A, a second slave feedback stage 114B that is identical to the first slave feedback stage 114A (except that the second slave feedback stage 114B receives the second feedback bit signal 56 from an inverter 60B, the first feedback bit signal 54 from the SSE(I), and the third feedback bit signal 58 from the SSE(III)), the inverter 60B that is identical to the inverter 60A, and an inverter 66B that is identical to the inverter 66A. However, the inverter 66B generates the final output bit signal 68B. A clock signal path 38B is identical to the clock signal path 38A but receives the clock signal 20B.

The SSE(III) is a flip-flop 108C that is identical to the flip-flop 108A, except that the flip-flop 108C generates the third feedback bit signal 58, receives the first feedback bit signal 54 from the SSE(I), receives the second feedback bit signal 56 from the SSE(II), receives the third data input bit signal 102C, and receives a third multiplexer test mode input 116C. More specifically, the flip-flop 108C includes a third multiplexer 110C that is identical to the first multiplexer 110A, except the third multiplexer 110C is configured to receive the third data input bit signal 102C and the third multiplexer test mode input 116C (which is directly analogous to, but independent of, the first multiplexer test mode input 116A) in order to control the flip-flop 108C independently. Furthermore, the flip-flop 108C includes a third master latch 72C that is identical to the master latch 72A, a third master sampling stage 73C that is identical to the first master sampling stage 73A, a third master feedback stage 78C that is identical to first master feedback stage 78A, an inverter 79C that is identical to the inverter 79A, a storage node 81C that is identical to the storage node 81A, a third slave latch 112C that is identical to the slave latch 112A, a third slave sampling stage 44C that is identical to the first slave sampling stage 44A, a storage node 52C that is identical to the storage node 52A, a third slave feedback stage 114C that is identical to the first slave feedback stage 114A (except that the first slave feedback stage receives the third feedback bit signal 58 from an inverter 60C, the first feedback bit signal 54 from the SSE(I), and the second feedback bit signal 56 from the SSE (II)), the inverter 60C that is identical to the inverter 60A, and an inverter 66C that is identical to the inverter 66A. However, the inverter 66C generates the final output bit signal 68C. A clock signal path 38C is identical to the clock signal path 38A but receives the clock signal 20C. Note that in this embodiment, each of the SSE(I), the SSE(II), and the SSE(III) is clocked independently. That way, radiation strikes cannot affect all of the clock signals 20A, 20B, 20C at once. However, this is optional. In alternative embodiments, the SSE(I), the SSE(II), and the SSE(III) may each be clocked by the same clock signal (e.g., the clock signal 20A) and be coupled to the same clock signal path (e.g., the clock signal path 38A).

During normal operation, the test control circuit 186 generates the first multiplexer test mode input 116A so that the first data input bit signal 102A is selected by the first multiplexer 110A, the second multiplexer test mode input 116B so that the second data input bit signal 102B is selected by the second multiplexer 110B, and the third multiplexer test mode input 116C so that the third data input bit signal 102C is selected by the third multiplexer 110C. However, to test the CLC in the pipeline stage 14A of the TMRPS PS1, the test control circuit 186 generates the first multiplexer test mode input 116A so that the first multiplexer 110A of the flip-flop 108A causes the flip-flop 108A to set up the first feedback bit state of the first feedback bit signal 54 in accordance with the first data input bit state of the first data input bit signal 102A, generates the second multiplexer test mode input 116B so that the second multiplexer 110B of the flip-flop 108B causes the flip-flop 108B to set the second feedback bit state of the second feedback bit signal 56 to a first logical bit value (e.g., the logical bit value "1"), and generates the third multiplexer test mode input 116C so that the third multiplexer 110C of the flip-flop 108C causes the flip-flop 108C to set the third feedback bit state of the third feedback bit signal 58 to a second logical bit value (e.g., the logical bit value "0"). During set up, the clock signals 20A, 20B, 20C are generated normally.

In one embodiment, the clock signals 20A, 20B, 20C continue to be generated normally after set up. The majority bit state is detected by detecting the final output bit signal state of any of the final output bit signals 68A, 68B, 68C. However, in an alternative embodiment, the clock signal 20B is held at a clock state such that the second master latch 72B is maintained opaque and the second slave latch 112B is maintained transparent during the testing cycle after set up. Furthermore, the clock signal 20C is held at a clock state such that the third master latch 72C is maintained opaque and the third slave latch 112C is maintained transparent during the testing cycle after set up. Accordingly, the second slave feedback stage 114B is maintain inactivated and the third slave feedback stage 114C is maintained inactivated after set up. The majority bit state is detected by detecting the final output bit signal state of the final output bit signal 68A. The CLC of the pipeline stage 14B and the CLC of the pipeline stage 14C can each be tested in an analogous manner.

Figure 19:
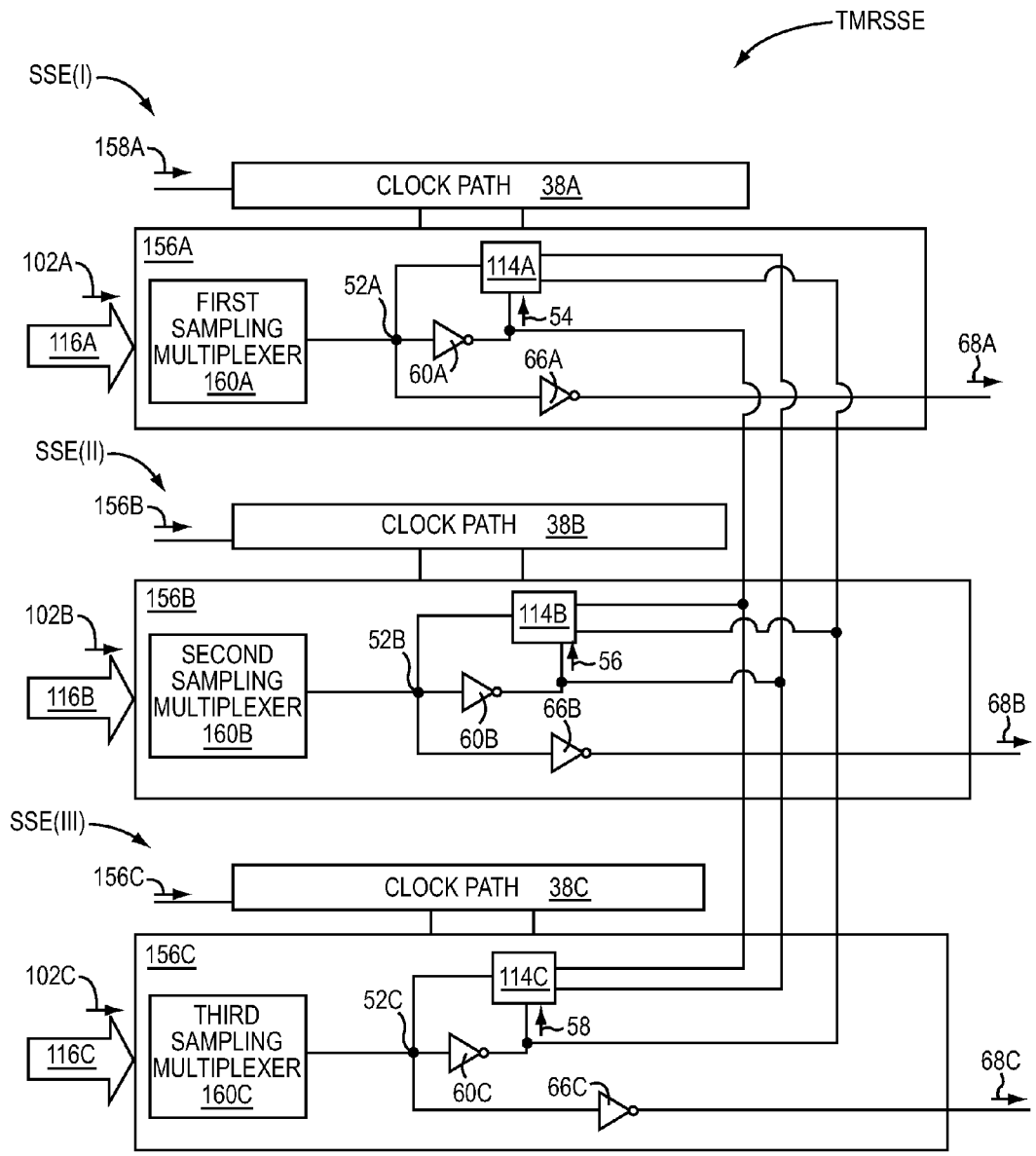
FIG. 19 illustrates one embodiment of the TMRSSE shown in FIG. 16 wherein each of the SSEs in the TMRSSE is provided in accordance with the SSE shown in FIG. 12.

FIG. 19 illustrates one embodiment of the TMRSSE shown in FIG. 16, which includes one embodiment of the SSE(I), the SSE(II) and the SSE(III). In this embodiment, the SSE(I) is the pulsed clock latch 156 shown in FIG. 12, which in this embodiment is referred to as a pulsed clock latch 156A for the sake of clarity. Thus, the first sampling multiplexer 160 is referred to as a first sampling multiplexer 160A, the storage node 52 is referred to as the storage node 52A, the first feedback stage 114 is referred to as the first slave feedback stage 114A, the inverter 60 is referred to as the inverter 60A, and the inverter 66 is referred to as the inverter 66A. The first sampling multiplexer 160A is configured to receive the first data input bit signal 102A and the first multiplexer test mode input 116A. The clock signal path 38 is referred to as the clock signal path 38A, which receives the asymmetric clock signal 158 (referred to as the asymmetric clock signal 158A in this embodiment).

The SSE(II) is a pulsed clock latch 156B that is identical to the pulsed clock latch 156A, except that the pulsed clock latch 156B generates the second feedback bit signal 56, receives the first feedback bit signal 54 from the SSE(I), receives the third feedback bit signal 58 from the SSE(III), receives the second data input bit signal 102B, and receives the second multiplexer test mode input 116B. More specifically, the pulsed clock latch 156B includes a second sampling multiplexer 160B that is identical to the first sampling multiplexer 160A, except the second sampling multiplexer 160B is configured to receive the second data input bit signal 102B and the second multiplexer test mode input 116B (which is directly analogous to, but independent of, the first multiplexer test mode input 116A) in order to control the pulsed clock latch 156B independently. Furthermore, the pulsed clock latch 156B includes the storage node 52B, which is identical to the storage node 52B; a second slave feedback stage 114B that is identical to the first slave feedback stage 114A (except that the second slave feedback stage 114B receives the second feedback bit signal 56 from the inverter 60B, the first feedback bit signal 54 from the SSE(I) and the third feedback bit signal 58 from the SSE(III)); the inverter 60B, which is identical to the inverter 60A, and the inverter 66B, which is identical to the inverter 66A. However, the inverter 66B generates the final output bit signal 68B. A clock signal path 38B is identical to the clock signal path 38A, but receives an asymmetric clock signal 158B.

The SSE(III) is a pulsed clock latch 156C that is identical to the pulsed clock latch 156A, except that the pulsed clock latch 156C generates the third feedback bit signal 58, receives the first feedback bit signal 54 from the SSE(I), receives the second feedback bit signal 56 from the SSE(II), receives the third data input bit signal 102C, and receives the third multiplexer test mode input 116C. More specifically, the pulsed clock latch 156C includes a third sampling multiplexer 160C that is identical to the first sampling multiplexer 160A, except the third sampling multiplexer 160C is configured to receive the third data input bit signal 102C and the third multiplexer test mode input 116C (which is directly analogous to, but independent of, the first multiplexer test mode input 116A) in order to control the pulsed clock latch 156C independently. Furthermore, the pulsed clock latch 156C includes the storage node 52C that is identical to the storage node 52A, a third slave feedback stage 114C that is identical to the first slave feedback stage 114A (except that the third slave feedback stage 114C receives the third feedback bit signal 58 from the inverter 60C, the first feedback bit signal 54 from the SSE(I), and the second feedback bit signal 56 from the SSE(II)), the inverter 60C that is identical to the inverter 60A, and the inverter 66C that is identical to the inverter 66A. However, the inverter 66C generates the final output bit signal 68C. The clock signal path 38C is identical to the clock signal path 38A, but receives an asymmetric clock signal 158C. Note that in this embodiment, each of the SSE(I), the SSE(II), and the SSE(III) is clocked independently. However, in alternative embodiments, the SSE(I), the SSE(II), and the SSE(III) may each be clocked by the same asymmetric clock signal (e.g., the asymmetric clock signal 158A) and be coupled to the same clock signal path (e.g., the clock signal path 38A). Therefore, a master latch is not included in the SSE(I), the SSE(II), and the SSE(III).

During normal operation, the test control circuit 186 generates the first multiplexer test mode input 116A so that the first data input bit signal 102A is selected by the first sampling multiplexer 160A, the second multiplexer test mode input 116B so that the second data input bit signal 102B is selected by the second sampling multiplexer 160B, and the third multiplexer test mode input 116C so that the third data input bit signal 102C is selected by the third sampling multiplexer 160C. However, to test the CLC in the pipeline stage 14A of the TMRPS PS1, the test control circuit 186 generates the first multiplexer test mode input 116A so that the first sampling multiplexer 160A of the pulsed clock latch 156A causes the pulsed clock latch 156A to set up the first feedback bit state of the first feedback bit signal 54 in accordance with the first data input bit state of the first data input bit signal 102A, generates the second multiplexer test mode input 116B so that the second sampling multiplexer 160B of the pulsed clock latch 156B causes the pulsed clock latch 156B to set the second feedback bit state of the second feedback bit signal 56 to a first logical bit value (e.g., a logical bit value "1"), and generates the third multiplexer test mode input 116C so that the third sampling multiplexer 160C of the pulsed clock latch 156C causes the pulsed clock latch 156C to set the third feedback bit state of the third feedback bit signal 58 to a second logical bit value (e.g., a logical bit value "0"). The majority bit state is detected by detecting the final output bit signal state of any of the final output bit signals 68A, 68B, 68C after set up. The CLC of the pipeline stage 14B and the CLC of the pipeline stage 14C can each be tested in an analogous manner.

Figure 20:
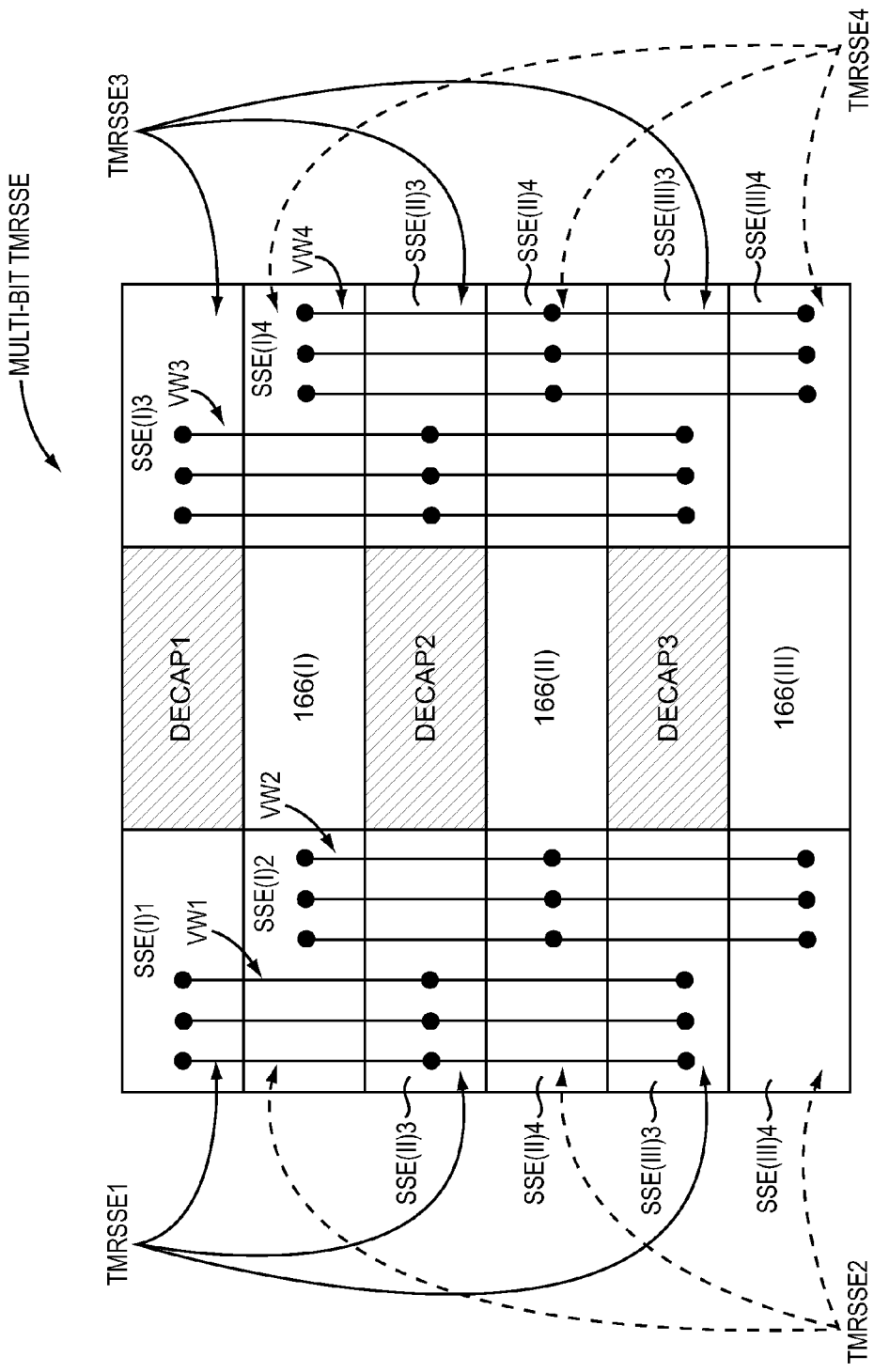
FIG. 20 illustrates one embodiment of a multiple-bit TMRSSE having four TMRSSEs, wherein each of the TMRSSEs is provided in accordance with the TMRSSE shown in FIG. 19.

FIG. 20 illustrates a macro block layout of a multi-bit TMRSSE. More specifically, the multi-bit TMRSSE is a four-bit TMRSSE and includes a TMRSSE(1) that has an SSE(I)1, an SSE(II)1, and an SSE(III)1. The SSE(I)1, the SSE(II)1, and the SSE(III)1 are each identical to the TMRSSE shown in FIG. 19. Three voting wires VW1 for the TMRSSE(1) connect the feedback stages (not shown) and are also shown in FIG. 20.

The multi-bit TMRSSE also includes a TMRSSE(2) that has an SSE(I)2, an SSE(II)2, and an SSE(III)2. The SSE(I)2, the SSE(II)2, and the SSE(III)2 are also identical to the TMRSSE shown in FIG. 19. Three voting wires VW2 for the TMRSSE(2) connect the feedback stages (not shown) and are also shown in FIG. 20.

The multi-bit TMRSSE also includes a TMRSSE(3) that has an SSE(I)3, an SSE(II)3, and an SSE(III)2. The SSE(I)3, the SSE(II)3, and the SSE(III)3 are also identical to the TMRSSE shown in FIG. 19. Three voting wires VW3 for the TMRSSE(3) connect the feedback stages (not shown) and are also shown in FIG. 20.

The multi-bit TMRSSE also includes a TMRSSE(4) that has an SSE(I)4, an SSE(II)4, and an SSE(III)4. The SSE(I)4, the SSE(II)4, and the SSE(III)4 are also identical to the TMRSSE shown in FIG. 19. Three voting wires VW4 for the TMRSSE(4) connect the feedback stages (not shown) and are also shown in FIG. 20.

A clock generation circuit 166(I) is identical to the clock generation circuit 166 shown in FIG. 14 and is configured to generate the asymmetric clock signal 158A that clocks the SSE(I)1, the SSE(I)2, the SSE(I)3, and the SSE(I)4. A clock generation circuit 166(II) is identical to the clock generation circuit 166 shown in FIG. 14 and is configured to generate the asymmetric clock signal 158B that clocks the SSE(II)1, the SSE(II)2, the SSE(II)3, and the SSE(II)4. A clock generation circuit 166(III) is identical to the clock generation circuit 166 shown in FIG. 14 and is configured to generate the asymmetric clock signal 158C that clocks the SSE(III)1, the SSE(III)2, the SSE(III)3, and the SSE(III)4. Decoupling capacitors DECAP1, DECAP2, and DECAP3 may be utilized to isolate the clock generation circuits 166(I), 166(II), 166(III).

Those skilled in the art will recognize improvements and modifications to the preferred embodiments of the present disclosure. All such improvements and modifications are considered within the scope of the concepts disclosed herein and the claims that follow.

What is claimed is:

1. A sequential state element (SSE) comprising:
   a multiplexer operable to generate a first bit signal having a first bit state by being configured to select between setting the first bit state to a first logical bit value, setting the first bit state to a second logical bit value opposite the first logical bit value, and setting the first bit state in accordance with a first data bit state of a first data bit signal in response to a multiplexer test mode input; and
   a feedback stage operably associated with the multiplexer such that a first feedback bit state of a first feedback bit signal is set up in accordance with the first bit state of the first bit signal, the feedback stage being configured to:
      receive the first feedback bit signal, a second feedback bit signal having a second feedback bit state, and a third feedback bit signal having a third feedback bit state; and
      hold a first output bit state of a first output bit signal in accordance with a majority bit state of the first feedback bit signal, the second feedback bit signal, and the third feedback bit signal.

2. The SSE of claim 1 further comprising a master latch and a sampling stage wherein:
   the multiplexer generates the first bit signal as an initial input bit signal and the first bit state is an initial input bit state of the initial input bit signal;
   the master latch is coupled to the multiplexer so as to receive the initial input bit signal from the multiplexer, wherein the master latch is configured to:
      sample the initial input bit signal; and
      generate an intermediary input bit signal having an intermediary input bit state set in accordance with the initial input bit state; and
   the sampling stage is coupled to receive the intermediary input bit signal from the master latch and is configured to:
      sample the intermediary input bit signal; and
      generate the first output bit signal having the first output bit state provided in accordance with the intermediary input bit state, wherein the first feedback bit signal provides feedback for the first output bit signal to the feedback stage.

3. The SSE of claim 2 further comprising a slave latch that includes the sampling stage and the feedback stage.

4. The SSE of claim 2 wherein:
   the sampling stage is configured to sample the intermediary input bit signal while a clock signal is in a first clock state and generate the first output bit signal having the first output bit state provided in accordance with the intermediary input bit state while the clock signal is in the first clock state; and
   the feedback stage is configured to hold the first output bit state of the first output bit signal in accordance with the majority bit state of the first feedback bit signal, the second feedback bit signal, and the third feedback bit signal while the clock signal is in a second clock state.

5. The SSE of claim 4 further comprising a storage node wherein:
the storage node is coupled to receive the first output bit signal from the sampling stage while the clock signal is in the first clock state; and
the feedback stage is configured to hold the first output bit state of the first output bit signal in accordance with the majority bit state of the first feedback bit signal, the second feedback bit signal, and the third feedback bit signal at the storage node while the clock signal is in the second clock state.

6. The SSE of claim 2 wherein:
the sampling stage is configured to sample the intermediary input bit signal while a clock signal is in a first clock state and generate the first output bit signal having the first output bit state provided in accordance with the intermediary input bit state while the clock signal is in the first clock state; and
the master latch is further configured to:
sample the initial input bit signal while the clock signal is in a second clock state; and
generate the intermediary input bit signal by being configured to:
generate an intermediary output bit signal having an intermediary output bit state;
set the intermediary output bit state in accordance with the initial input bit state of the initial input bit signal while the clock signal is in the second clock state;
generate the intermediary input bit signal from the intermediary output bit signal such the intermediary input bit state is set in accordance with the intermediary output bit state of the intermediary output bit signal; and
hold the intermediary output bit state of the intermediary output bit signal while the clock signal is in the first clock state.

7. The SSE of claim 6 wherein the multiplexer and the feedback stage are operably associated by the master latch and the sampling stage, whereby the first feedback bit state is set up in accordance with the initial input bit state while the clock signal is in the first clock state.

8. The SSE of claim 1, wherein the multiplexer comprises a sampling multiplexer configured to generate the first bit signal as the first output bit signal such that the first bit state is the first output bit state of the first output bit signal while a clock signal is in a first clock state.

9. The SSE of claim 8 wherein the feedback stage is configured to hold the first output bit state of the first output bit signal in accordance with the majority bit state of the first feedback bit signal, the second feedback bit signal, and the third feedback bit signal while the clock signal is in a second clock state.

10. The SSE of claim 9 further comprising a clock generation circuit configured to:
receive a second clock signal configured to oscillate between the first clock state and the second clock state with approximately a first duty cycle equal to approximately fifty percent; and
generate the clock signal so that the clock signal oscillates between the first clock state and the second clock state with a second duty cycle such that the second clock state is significantly longer than the first clock state.

11. The SSE of claim 8 wherein the SSE does not include a master latch.

12. The SSE of claim 8 further comprising a storage node wherein:
the storage node is coupled to receive the first output bit signal from the sampling multiplexer while the clock signal is in the first clock state; and
the feedback stage is configured to hold the first output bit state of the first output bit signal in accordance with the majority bit state of the first feedback bit signal, the second feedback bit signal, and the third feedback bit signal at the storage node while the clock signal is in a second clock state.

13. The SSE of claim 1 wherein the multiplexer is configured to receive the first data bit signal as a data line bit signal.

14. The SSE of claim 1 wherein the multiplexer is configured to receive the first data bit signal as a scan mode bit signal.

15. The SSE of claim 1 wherein the multiplexer is further configured to select that the first data bit state be set in accordance with a second data bit state of a second data bit signal in response to the multiplexer test mode input, wherein the first data bit signal is a data line bit signal and the second data bit signal is a scan mode bit signal.

16. The SSE of claim 1, wherein the feedback stage is configured to generate a feedback output bit signal at a feedback output bit state so as to drive the first output bit state of the first output bit signal in accordance with the majority bit state of the first feedback bit signal, the second feedback bit signal, and the third feedback bit signal.

17. The SSE of claim 16 wherein the feedback stage comprises a majority gate configured to:
receive the first feedback bit signal, the second feedback bit signal, and the third feedback bit signal;
set the feedback output bit state in accordance with the majority bit state of the first feedback bit signal, the second feedback bit signal, and the third feedback bit signal while a clock signal is in a first clock state; and
deactivate while the clock signal is in a second clock state.

18. The SSE of claim 1 wherein the multiplexer is further configured to:
receive the multiplexer test mode input such that the multiplexer test mode input is bound to a group of selection states that includes a first selection state, a second selection state, and a third selection state; and
select between setting the first bit state to the first logical bit value, setting the first bit state to the second logical bit value, and setting the first bit state in accordance with the first data bit state of the first data bit signal in response to the multiplexer test mode input by being configured to:
select that the first bit state be set in accordance with the first data bit state of the first data bit signal in response to the multiplexer test mode input being provided in the first selection state;
select that the first bit state be set to the first logical bit value in response to the multiplexer test mode input being provided in the second selection state; and
select that the first bit state be set to the second logical bit value in response to the multiplexer test mode input being provided in the third selection state.

19. A triple-mode redundant sequential state element (TMRSSE) comprising:
a first sequential state element (SSE) comprising:
a first multiplexer operable to generate a first bit signal having a first bit state by being configured to select between setting the first bit state to a first logical bit value, setting the first bit state to a second logical bit value opposite the first logical bit value, and setting the first bit state in accordance with a first data bit state of a first data bit signal in response to a first multiplexer test mode input; and
a first feedback stage operably associated with the first multiplexer such that a first feedback bit state of a first feedback bit signal is set up in accordance with the first bit state of the first bit signal, the first feedback stage being configured to:
receive the first feedback bit signal, a second feedback bit signal having a second feedback bit state, and a third feedback bit signal having a third feedback bit state; and
hold a first output bit state of a first output bit signal in accordance with a majority bit state of the first feedback bit signal, the second feedback bit signal, and the third feedback bit signal;
a second SSE configured to generate the second feedback bit signal; and
a third SSE configured to generate the third feedback bit signal.

20. The TMRSSE of claim 19 wherein the second SSE comprises:
a second multiplexer operable to generate a second bit signal having a second bit state by being configured to select between setting the second bit state to the first logical bit value, setting the second bit state to the second logical bit value, and setting the second bit state in accordance with a second data bit state of a second data bit signal in response to a second multiplexer test mode input; and
a second feedback stage operably associated with the second multiplexer such that the second feedback bit state of the second feedback bit signal is set up in accordance with the second bit state of the second bit signal, the second feedback stage being configured to:
receive the first feedback bit signal, the second feedback bit signal, and the third feedback bit signal; and
hold a second output bit state of a second output bit signal in accordance with the majority bit state of the first feedback bit signal, the second feedback bit signal, and the third feedback bit signal.

21. The TMRSSE of claim 20 wherein the third SSE comprises:
a third multiplexer operable to generate a third bit signal having a third bit state by being configured to select between setting the third bit state to the first logical bit value, setting the third bit state to the second logical bit value, and setting the third bit state in accordance with a third data bit state of a third data bit signal in response to a third multiplexer test mode input; and
a third feedback stage operably associated with the third multiplexer such that the third feedback bit state of the third feedback bit signal is set up in accordance with the third bit state of the third bit signal, the third feedback stage being configured to:
receive the first feedback bit signal, the second feedback bit signal, and the third feedback bit signal; and
hold a third output bit state of a third output bit signal in accordance with the majority bit state of the first feedback bit signal, the second feedback bit signal, and the third feedback bit signal.

22. The TMRSSE of claim 19 wherein the first SSE further comprises a first master latch and a first sampling stage wherein:
the first multiplexer generates the first bit signal as an initial input bit signal and the first bit state is an initial input bit state of the initial input bit signal;
the first master latch is coupled to the first multiplexer so as to receive the initial input bit signal from the first multiplexer, wherein the first master latch is configured to:
sample the initial input bit signal; and
generate a first intermediary input bit signal having a first intermediary input bit state set in accordance with the initial input bit state;
the first sampling stage is coupled to receive the first intermediary input bit signal from the first master latch and is configured to:
sample the first intermediary input bit signal; and
generate the first output bit signal having the first output bit state provided in accordance with the first intermediary input bit state, wherein the first feedback bit signal provides feedback for the first output bit signal to the first feedback stage.

23. The TMRSSE of claim 19 wherein the first multiplexer of the first SSE comprises a first sampling multiplexer configured to generate the first bit signal as the first output bit signal such that the first bit state is the first output bit state of the first output bit signal.

24. A method of testing a triple-mode redundant pipeline stage (TMRPS) with a triple-mode redundant sequential state element (TMRSSE) having a first sequential state element (SSE), a second SSE, and a third SSE, the method comprising:
setting up a first feedback bit state of a first feedback bit signal generated by the first SSE in accordance with a first data bit state of a first data bit signal during a testing cycle;
setting up a second feedback bit state of a second feedback bit signal generated by the second SSE to a first logical bit value during the testing cycle;
setting up a third feedback bit state of a third feedback bit signal generated by the third SSE to a second logical bit value opposite the first logical bit value during the testing cycle; and
detecting a majority bit state of the first feedback bit signal, the second feedback bit signal, and the third feedback bit signal during the testing cycle.

25. The method of claim 24 further comprising:
setting up the first feedback bit state of the first feedback bit signal generated by the first SSE to the first logical bit value during a second testing cycle;
setting up the second feedback bit state of the second feedback bit signal in accordance with a second data bit state of a second data bit signal during the second testing cycle;
setting up the third feedback bit state of the third feedback bit signal to the second logical bit value during the second testing cycle; and
detecting the majority bit state of the first feedback bit signal, the second feedback bit signal, and the third feedback bit signal during the second testing cycle.

26. The method of claim 25 further comprising:
setting up the first feedback bit state of the first feedback bit signal generated by the first SSE to the first logical bit value during a third testing cycle;
setting up the second feedback bit state of the second feedback bit signal to the second logical bit value during the third testing cycle;
setting up the third feedback bit state of the third feedback bit signal in accordance with a third data bit state of a third data bit signal during the third testing cycle; and
detecting the majority bit state of the first feedback bit signal, the second feedback bit signal, and the third feedback bit signal during the third testing cycle.

27. The method of claim 24 wherein the first SSE comprises a first flip-flop having a first master latch and a first slave latch, the second SSE comprises a second flip-flop having a second master latch and a second slave latch, and the third SSE comprises a third flip-flop having a third master latch and a third slave latch.

28. The method of claim 27 further comprising:
generating a first clock signal;
transmitting the first clock signal to the first SSE;
generating a second clock signal;
transmitting the second clock signal to the second SSE;
generating a third clock signal;
transmitting the third clock signal to the third SSE.

29. The method of claim 28 further comprising:
generating the first clock signal normally throughout the testing cycle;
holding the second clock signal in a clock state such that the second master latch is maintained opaque and the second slave latch is maintained transparent during the testing cycle after setting up the second feedback bit state of the second feedback bit signal generated by the second SSE to the first logical bit value; and
holding the third clock signal in a clock state such that the third master latch is maintained opaque and the third slave latch is maintained transparent during the testing cycle after setting up the third feedback bit state of the third feedback bit signal generated by the third SSE to the second logical bit value.

30. The method of claim 28 further comprising:
generating the first clock signal normally throughout the testing cycle;
generating the second clock signal normally throughout the testing cycle; and
generating the third clock signal normally throughout the testing cycle.

31. The method of claim 24 wherein:
the first SSE comprises a first pulsed clock latch;
the second SSE comprises a second pulsed clock latch; and
the third SSE comprises a third pulsed clock latch.

32. The method of claim 31 wherein a master latch is not included in the first SSE, the second SSE, and the third SSE.

* * * * *